US012713576B2

(12) United States Patent
Kim et al.

(10) Patent No.: US 12,713,576 B2
(45) Date of Patent: Aug. 18, 2026

(54) SEMICONDUCTOR DEVICES

(71) Applicant: Samsung Electronics Co., Ltd., Suwon-si (KR)

(72) Inventors: Hongrae Kim, Seoul (KR); Hyukwoo Kwon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 891 days.

(21) Appl. No.: 17/940,816

(22) Filed: Sep. 8, 2022

(65) Prior Publication Data

US 2023/0135110 A1 May 4, 2023

(30) Foreign Application Priority Data

Nov. 3, 2021 (KR) ........................ 10-2021-0149428

(51) Int. Cl.
*H10B 12/00* (2023.01)

(52) U.S. Cl.
CPC ......... *H10B 12/0335* (2023.02); *H10B 12/09* (2023.02); *H10B 12/315* (2023.02); *H10B 12/50* (2023.02)

(58) Field of Classification Search
CPC .. H10B 12/0335; H10B 12/315; H10B 12/02; H10B 12/50; H10B 12/31; H10B 12/30
See application file for complete search history.

(56) References Cited

U.S. PATENT DOCUMENTS 8,901,605 B2 12/2014 Takada et al.
8,906,763 B2 12/2014 Park et al.
10,043,809 B1 8/2018 Chang et al.
10,103,057 B2 10/2018 Abelson et al.
10,665,592 B2 5/2020 Song et al.
11,152,374 B2 10/2021 Kim et al.
11,264,392 B2 3/2022 Kim et al.
2003/0109102 A1* 6/2003 Kujirai ............... H10B 12/0383 257/E21.396

(Continued)

FOREIGN PATENT DOCUMENTS

KR 101043408 B1 6/2011
KR 101139463 B1 5/2012

(Continued)

OTHER PUBLICATIONS

Translation of KR-20210024506-A (Year: 2021).*

*Primary Examiner* — Jessica S Manno
*Assistant Examiner* — Christopher A. Schodde
(74) *Attorney, Agent, or Firm* — Muir Patent Law, PLLC

(57) ABSTRACT

A semiconductor device includes a gate structure on a substrate, an insulating interlayer on the substrate and covering a sidewall of the gate structure, a capping layer on the gate structure and the insulating interlayer, a wiring on the capping layer, an insulation pattern on a bottom and a sidewall of an opening extending through the wiring and at least an upper portion of the capping layer, and an etch stop layer on the insulation pattern and the wiring. The insulation pattern includes a lower portion on the bottom of the opening and a lateral portion contacting the sidewall of the opening. A thickness of the lower portion of the insulation pattern from the bottom of the opening in a vertical direction is greater than a thickness of the lateral portion of the insulation pattern from the sidewall of the opening in a horizontal direction.

20 Claims, 37 Drawing Sheets

(56) References Cited

U.S. PATENT DOCUMENTS

| | | | | |
|---|---|---|---|---|
| 2005/0255661 | A1* | 11/2005 | Katsumata | H10D 84/038 257/E21.654 |
| 2010/0261347 | A1* | 10/2010 | Nobutoh | H10D 1/716 257/E21.585 |
| 2019/0206873 | A1* | 7/2019 | Kim | H10B 12/485 |
| 2020/0227315 | A1* | 7/2020 | Park | H01L 21/0274 |
| 2021/0193664 | A1 | 6/2021 | Seong et al. | |
| 2021/0296321 | A1* | 9/2021 | Heo | H01L 23/5329 |
| 2022/0262721 | A1* | 8/2022 | Choi | H01L 23/528 |

FOREIGN PATENT DOCUMENTS

| | | | | |
|---|---|---|---|---|
| KR | 101139483 | B1 | 5/2012 | |
| KR | 1020190063092 | A | 6/2019 | |
| KR | 1020190082579 | A | 7/2019 | |
| KR | 1020200145251 | A | 12/2020 | |
| KR | 20210024506 | A * | 3/2021 | H10B 12/315 |

* cited by examiner 365
345
255
245
235
225
375
185
175
165
195
140
130
120
150
112
100
103
420
450
380
410
430
440
390
400
A
A'
B
B'
D1
D2

510
500
365
345
255
245
235
225
375
400
390
103
A
A'
112
100
380
470
185
175
165
195
480
465
D2
D1
380
410
430
440
390
400
B
B'
140
130
120
150
450_1

552
542
255
245
235
225
185
175
165
195
140
130
120
150
112
100
B'
103
450_1
103
B
D1
D2
380
415
430
445
390
400
375
470
365
345
380
552
112
100
A'
480
465
A
532
512
502
103

542
255
245
235
225
185
175
165
195
140
130
120
150
112
100
B'
103
450_1
103
B
380
415
430
445
390
400
D2
D1
380
470
365
345
255
245
235
225
185
175
165
375
195
112
100
A'
480
465
A
542
512
502
532
365
345
255
245
235
225
375
430
415
380
445
400
390
103
D2
D1

600
580
570
542
255
245
235
225
185
175
165
195
140
130
120
150
112
100
B'
103
450_1
103
B
D2
D1
512
502
532
380
415
430
445
390
400
590
560
375
380
470
365
345
255
245
235
225
185
175
165
195
112
100
A'
542
480
465
A
542
512
502
532
365
345
255
245
235
225
375
430
415
380
445
400
390
103
D2
D1

SEMICONDUCTOR DEVICES

CROSS-REFERENCE TO RELATED APPLICATION(S)

This application claims priority under 35 U.S.C. § 119 to Korean Patent Application No. 10-2021-0149428 filed on Nov. 3, 2021 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a dynamic random access memory (DRAM) device.

DISCUSSION OF RELATED ART

In a DRAM device, a capacitor may be formed in a cell region of a substrate, and it has been more difficult to form the capacitor as the size of the DRAM device decreases. During the formation of the capacitor, structures on a peripheral circuit region of the substrate may be damaged. Accordingly, the structures of the peripheral circuit region are needed to prevent from being damaged during the formation of the capacitor.

SUMMARY

Example embodiments provide a semiconductor device having improved characteristics.

According to example embodiments of the inventive concepts, a semiconductor device may include a gate structure on a substrate, an insulating interlayer on the substrate and covering a sidewall of the gate structure, a capping layer on the gate structure and the insulating interlayer, a wiring on the capping layer, an insulation pattern on a bottom and a sidewall of an opening extending through the wiring and at least an upper portion of the capping layer, and an etch stop layer on the insulation pattern and the wiring. The insulation pattern may include a lower portion on the bottom of the opening and a lateral portion contacting the sidewall of the opening. A thickness of the lower portion of the insulation pattern from the bottom of the opening in a vertical direction substantially perpendicular to an upper surface of the substrate may be greater than a thickness of the lateral portion of the insulation pattern from the sidewall of the opening in a horizontal direction substantially parallel to the upper surface of the substrate.

According to example embodiments of the inventive concepts, a semiconductor device may include a gate structure on a substrate, an insulating interlayer on the substrate and covering a sidewall of the gate structure, a capping layer on the gate structure and the insulating interlayer, a wiring on the capping layer, and an insulation pattern on an upper surface of the capping layer and on a bottom and a sidewall of an opening extending through the wiring and at least an upper portion of the capping layer. The insulation pattern may include a lower portion on the bottom of the opening, a lateral portion contacting the sidewall of the opening, and an upper portion on the lateral portion and an upper surface of the wiring. A thickness of the lower portion of the insulation pattern from the bottom of the opening in a vertical direction substantially perpendicular to an upper surface of the substrate may be greater than a thickness of the lateral portion of the insulation pattern from the sidewall of the opening in a horizontal direction substantially parallel to the upper surface of the substrate.

According to example embodiments of the inventive concepts, a semiconductor device may include a substrate including a cell region and a peripheral circuit region, a first active pattern on the cell region of the substrate, a first gate structure buried at an upper portion of the first active pattern and extending in a first direction substantially parallel to an upper surface of the substrate, a bit line structure contacting a central upper surface of the first active pattern and extending in a second direction substantially parallel to the upper surface of the substrate and substantially perpendicular to the first direction, a contact plug structure on an end portion of the first active pattern, a capacitor on the contact plug structure, a second gate structure on the peripheral circuit region of the substrate, an insulating interlayer on the peripheral circuit region of the substrate and covering a sidewall of the second gate structure, a capping layer on the second gate structure and the insulating interlayer, a wiring on the capping layer, a first insulation pattern on a bottom and a sidewall of an opening extending through the wiring and at least an upper portion of the capping layer, and a first etch stop layer on the first insulation pattern and the wiring. The first insulation pattern may include a lower portion on the bottom of the opening and a lateral portion contacting the sidewall of the opening. A thickness of the lower portion of the first insulation pattern from the bottom of the opening in a vertical direction substantially perpendicular to an upper surface of the substrate may be greater than a thickness of the lateral portion of the first insulation pattern from the sidewall of the opening in a horizontal direction substantially parallel to the upper surface of the substrate.

In the semiconductor device, the insulation pattern and the etch stop layer having a sufficiently thick thickness on the peripheral circuit region of the substrate may be formed, and thus the failure due to the collapse of the insulating interlayer during the fabrication of the semiconductor device may be prevented.

DETAILED DESCRIPTION

Figure 1:
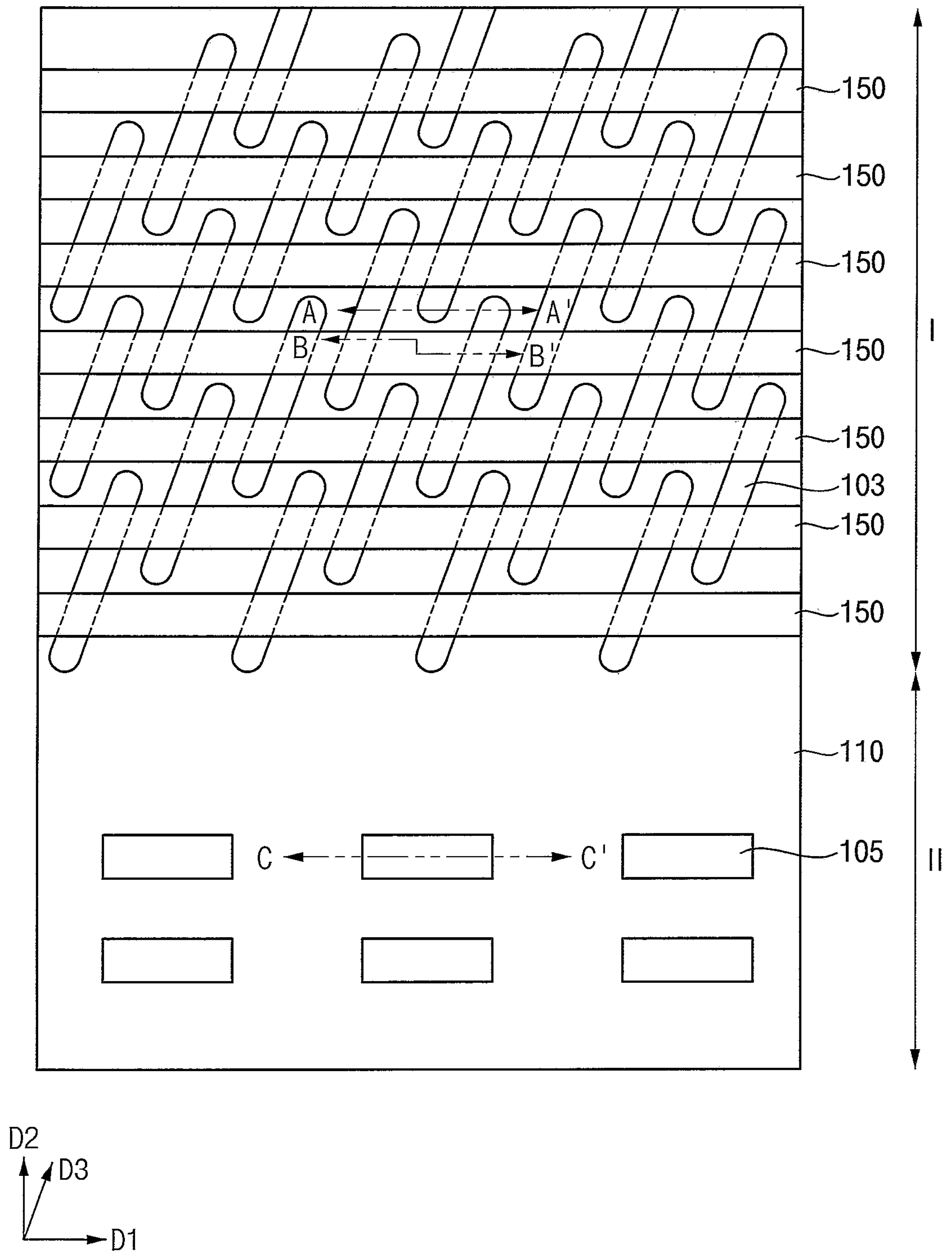
FIGS. 1 to 33 are plan views and cross-sectional views illustrating a method of manufacturing a semiconductor device according to example embodiments.

The above and other aspects and features of a method of cutting a fine pattern, a method of forming active patterns using the same, and a method of manufacturing a semiconductor device using the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Hereinafter, in the specification (and not necessarily in the claims), two directions substantially parallel to an upper surface of a substrate and substantially perpendicular to each other may be referred to as first and second directions D1 and D2, respectively, and a direction substantially parallel to the upper surface of the substrate and having an acute angle with respect to the first and second directions D1 and D2 may be referred to as a third direction D3. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

FIGS. 1 to 33 are plan views and cross-sectional views illustrating a method of manufacturing a semiconductor device according to example embodiments. Specifically, FIGS. 1, 6, 10, 14, 18 and 24 are the plan views, and each of FIGS. 2, 4, 7-8, 11, 15-17, 19-20, 22, 25, 27, 29 and 31-32 includes cross-sections taken along lines A-A' and B-B' of a corresponding plan view, and FIGS. 3, 5, 9, 12-13, 21, 23, 26, 28, 30 and 33 are cross-sectional views taken along lines C-C' of corresponding plan views, respectively.

Figure 2:
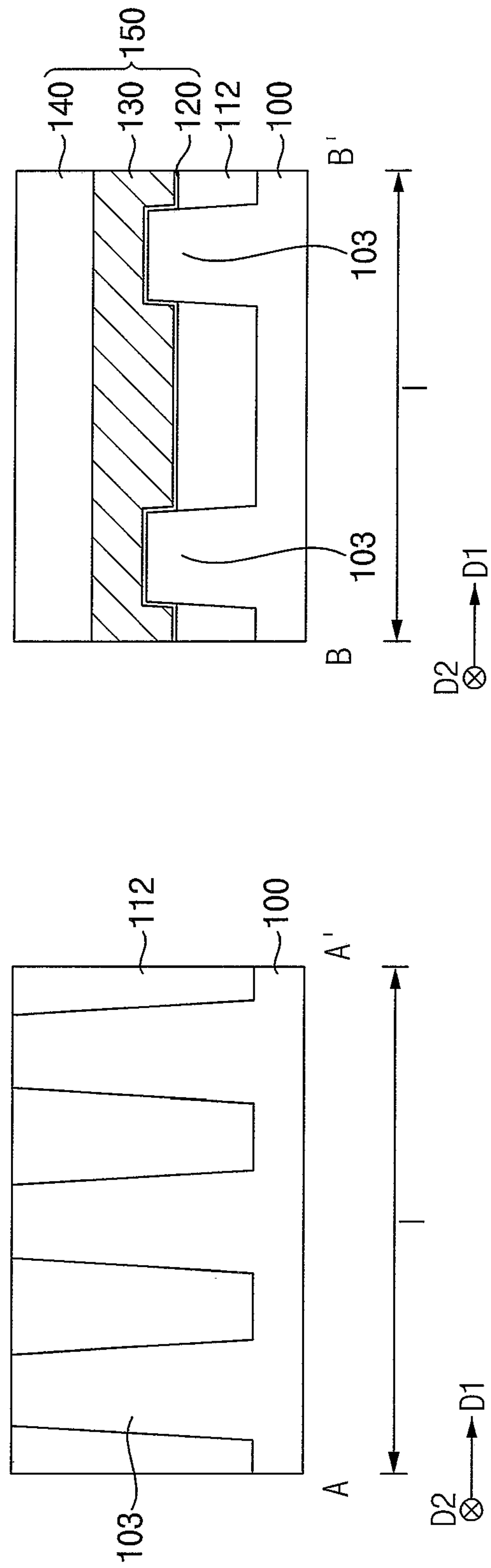
Figure 3:
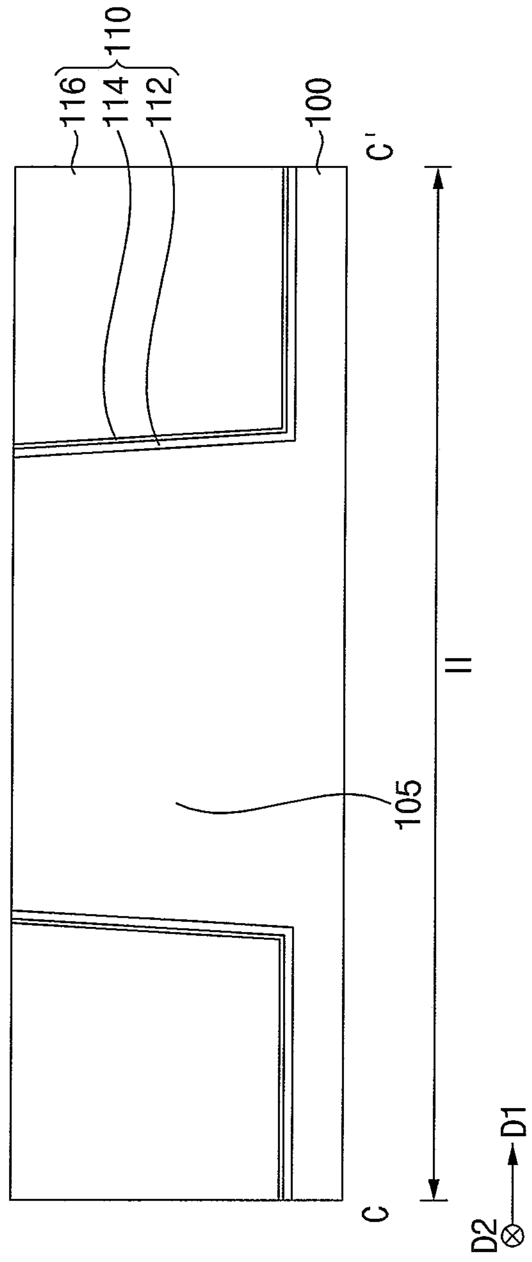

Referring to FIGS. 1 to 3, first and second active patterns 103 and 105 may be formed on a substrate 100 including first and second regions I and II, and an isolation pattern structure 110 may be formed to cover sidewalls of the first and second active patterns 103 and 105, respectively.

The substrate 100 may include or be formed of silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The first region I of the substrate 100 may be a cell region on which memory cells are formed, and the second region II of the substrate 100 may be a peripheral circuit region on which peripheral circuit patterns for driving the memory cells are formed. FIGS. 1 to 3 show a portion of the first region I, and a portion of the second region II adjacent to the first region I in the second direction D2.

The first and second active patterns 103 and 105 may be formed by removing an upper portion of the substrate 100 to form a first recess. The first active pattern 103 may extend in the third direction D3, and a plurality of first active patterns 103 may be spaced apart from each other in each of the first and second directions D1 an D2. Additionally, a plurality of second active patterns 105 may be spaced apart from each other in each of the first and second directions D1 and D2.

The isolation pattern structure 110 may include first to third isolation patterns 112, 114 and 116 sequentially stacked on an inner wall of the first recess. A portion of the first recess in the first region of the substrate 100 may have a relatively small width, and thus only the first isolation pattern 112 may be formed in the portion of the first recess. However, a portion of the first recess in the second region II or between the first and second regions I and II of the substrate 100 may have a relatively large width, and thus the first to third isolation patterns 112, 114 and 116 may be formed in the portion of the first recess.

The first and third isolation patterns 112 and 116 may have an oxide, e.g., silicon oxide, and the second isolation pattern 114 may include a nitride, e.g., silicon nitride.

The first active pattern 103 and the isolation pattern structure 110 in the first region I of the substrate 100 may be partially removed to form a second recess extending in the first direction D1.

A first gate structure 150 may be formed in the second recess. The first gate structure 150 may include a first gate insulation pattern 120 on an inner wall of the second recess, a gate electrode 130 on the first gate insulation pattern 120 to fill a lower portion of the second recess, and a first gate mask 140 on the gate electrode 130 to fill an upper portion of the second recess. The first gate structure 150 may extend in the first direction D1 on the first region I of the substrate 100, and a plurality of first gate structures 150 may be spaced apart from each other in the second direction D2.

The first gate insulation pattern 120 may include or be formed of an oxide, for example, silicon oxide. The gate electrode 130 may include or be formed of a metal, a metal nitride, a metal silicide, doped polysilicon, etc., and the first gate mask 140 may include or be formed of a nitride, e.g., silicon nitride.

Figure 4:
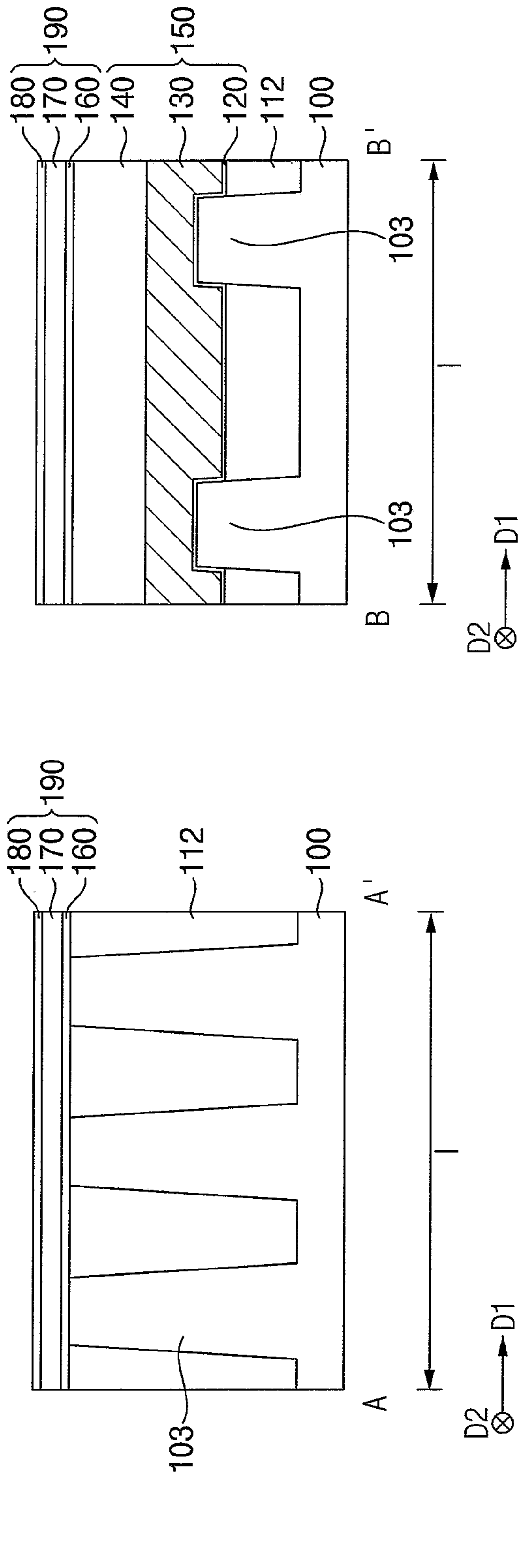
Figure 5:
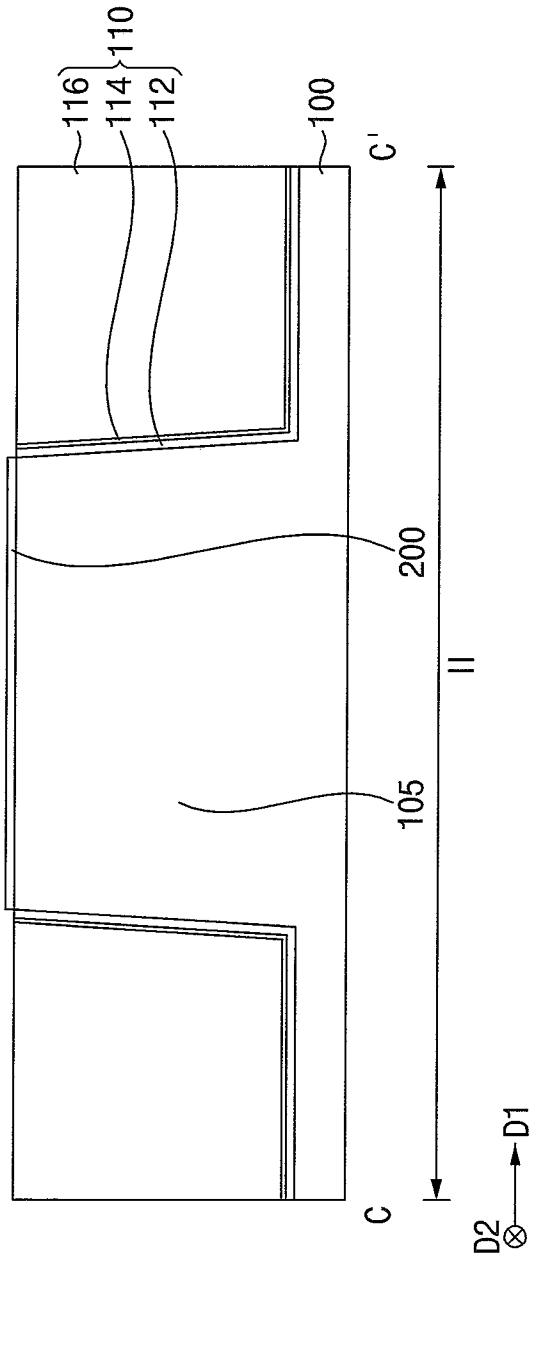

Referring to FIGS. 4 and 5, an insulation layer structure 190 may be formed on the first and second regions I and II of the substrate 100, a portion of the insulation layer structure 190 on the second region II of the substrate 100 may be removed, and, e.g., a thermal oxidation process may be performed on the second active pattern 105 on the second region II of the substrate 100 to form a second gate insulation layer 200.

The insulation layer structure 190 may include first to third insulation layers 160, 170 and 180 sequentially stacked. The first and third insulation layers 160 and 180 may include or be formed of an oxide, e.g., silicon oxide, and the second insulation layer 170 may include or be formed of a nitride, e.g., silicon nitride.

Figure 6:
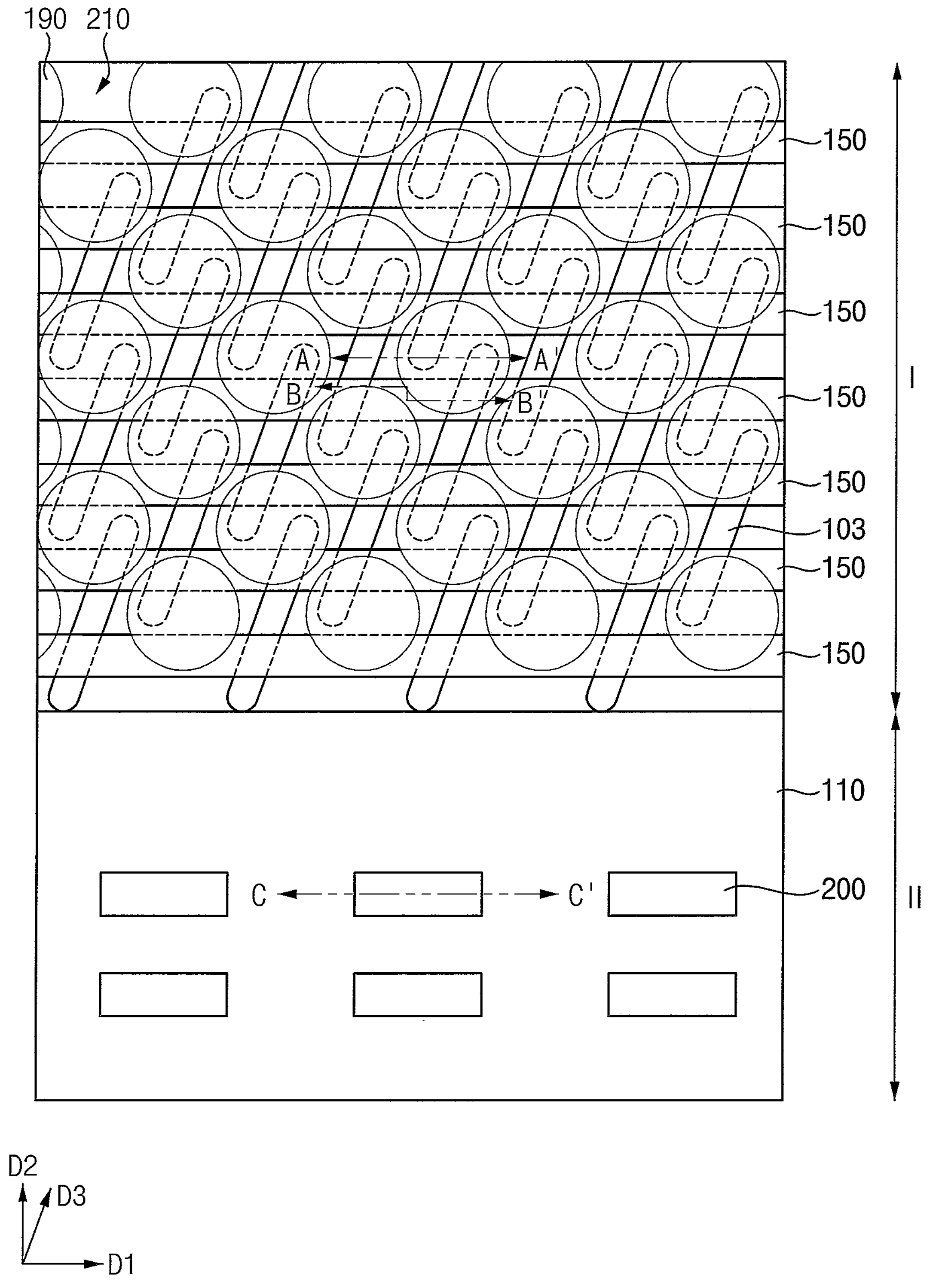
Figure 7:
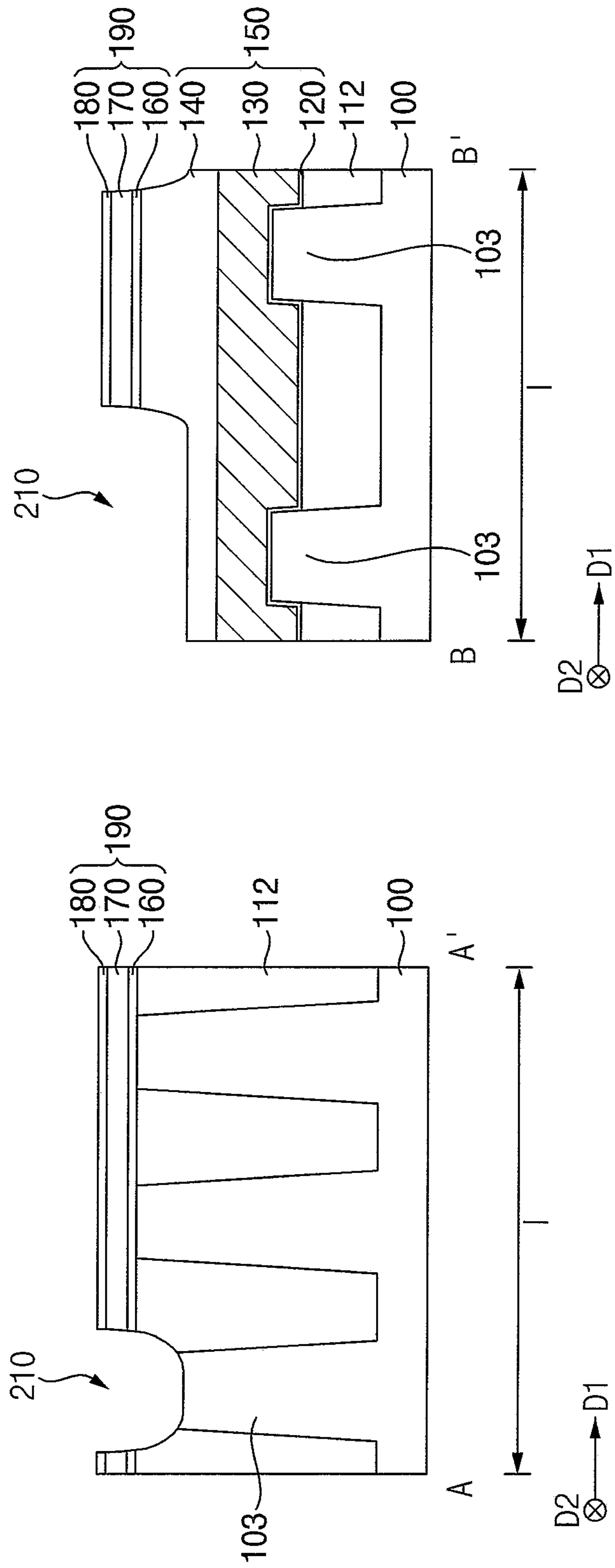

Referring to FIGS. 6 and 7, the insulation layer structure 190 may be patterned, and the first active pattern 103, the isolation pattern structure 110, and the first gate mask 140 of the first gate structure 150 may be partially etched using the patterned insulation layer structure 190 as an etching mask to form a first opening 210. In example embodiments, the patterned insulation layer structure 190 may have a shape of a circle or ellipse in a plan view, and a plurality of insulation layer structures 190 may be spaced apart from each other in the first and second directions D1 and D2 on the first region I of the substrate 100. Each of the insulation layer structures 190 may overlap opposite end portions in the third direction of the first active patterns 103 in a vertical direction substantially perpendicular to the upper surface of the substrate 100.

Figure 8:
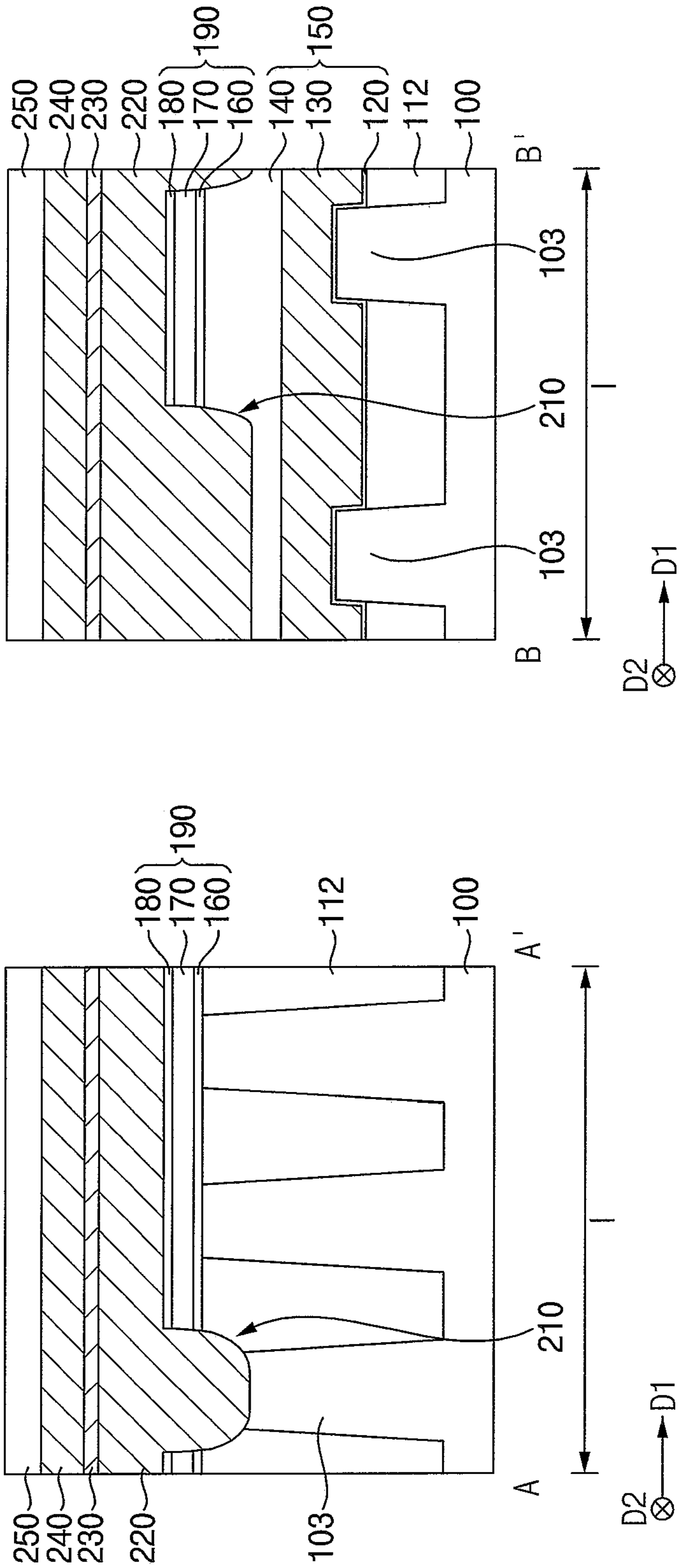
Figure 9:
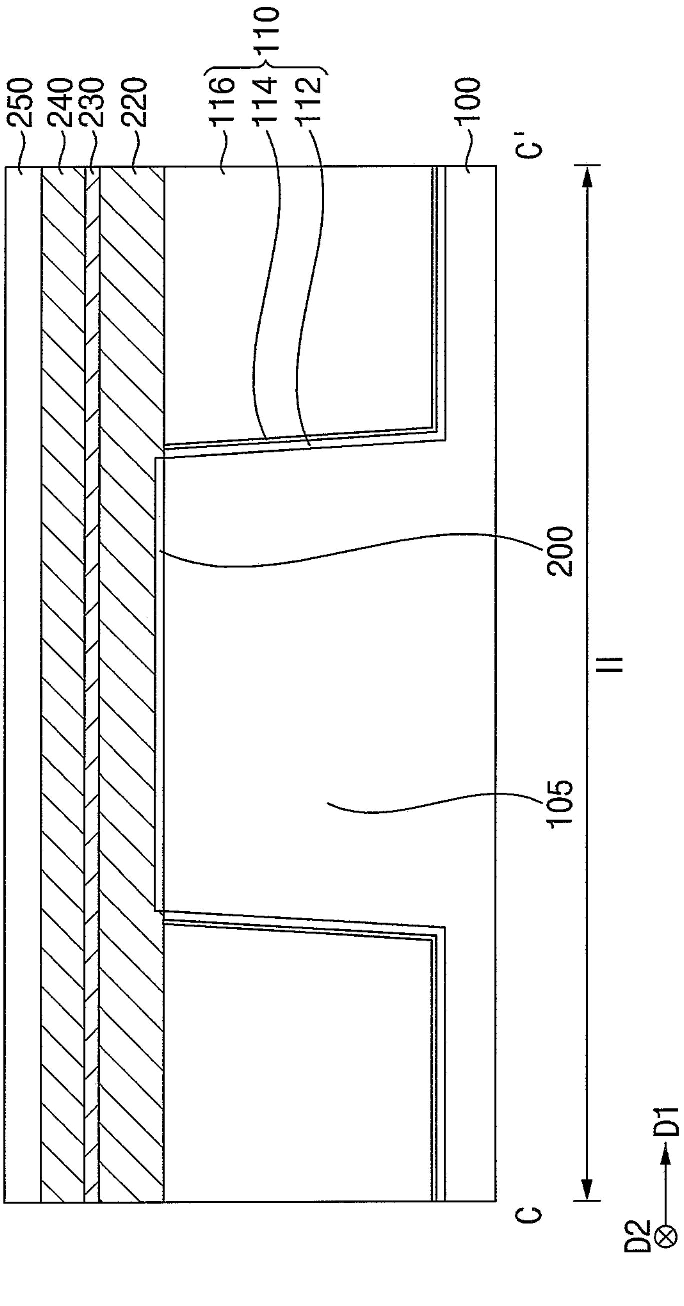

Referring to FIGS. 8 and 9, a first conductive layer 220, a first barrier layer 230, a second conductive layer 240 and a first mask layer 250 may be sequentially stacked on the insulation layer structure 190, the first active pattern 103 exposed by the first opening 210, the isolation pattern structure 110 (e.g., 112) and the first gate structure 150 on the first region I of the substrate 100, and the second gate insulation layer 200 and the isolation pattern structure 110 on the second region II of the substrate 100, which may form a conductive structure layer. The first conductive layer 220 may fill the first opening 210.

The first conductive layer 220 may include or be formed of doped polysilicon, the first barrier layer 230 may include or be formed of a metal silicon nitride, e.g., titanium silicon nitride, the second conductive layer 240 may include or be formed of a metal, e.g., tungsten, and the first mask layer 250 may include or be formed of a nitride, e.g., silicon nitride.

Figure 10:
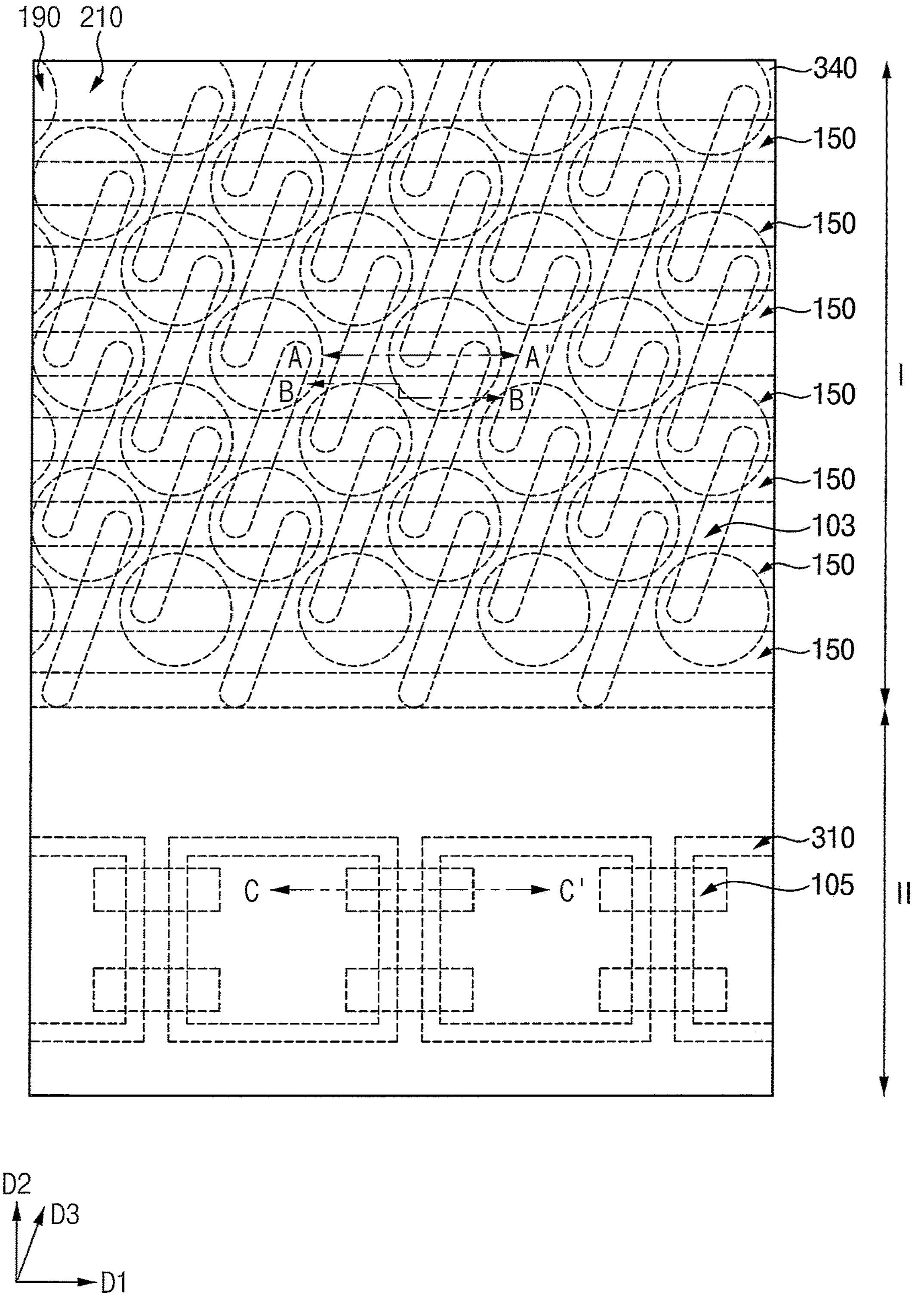
Figure 11:
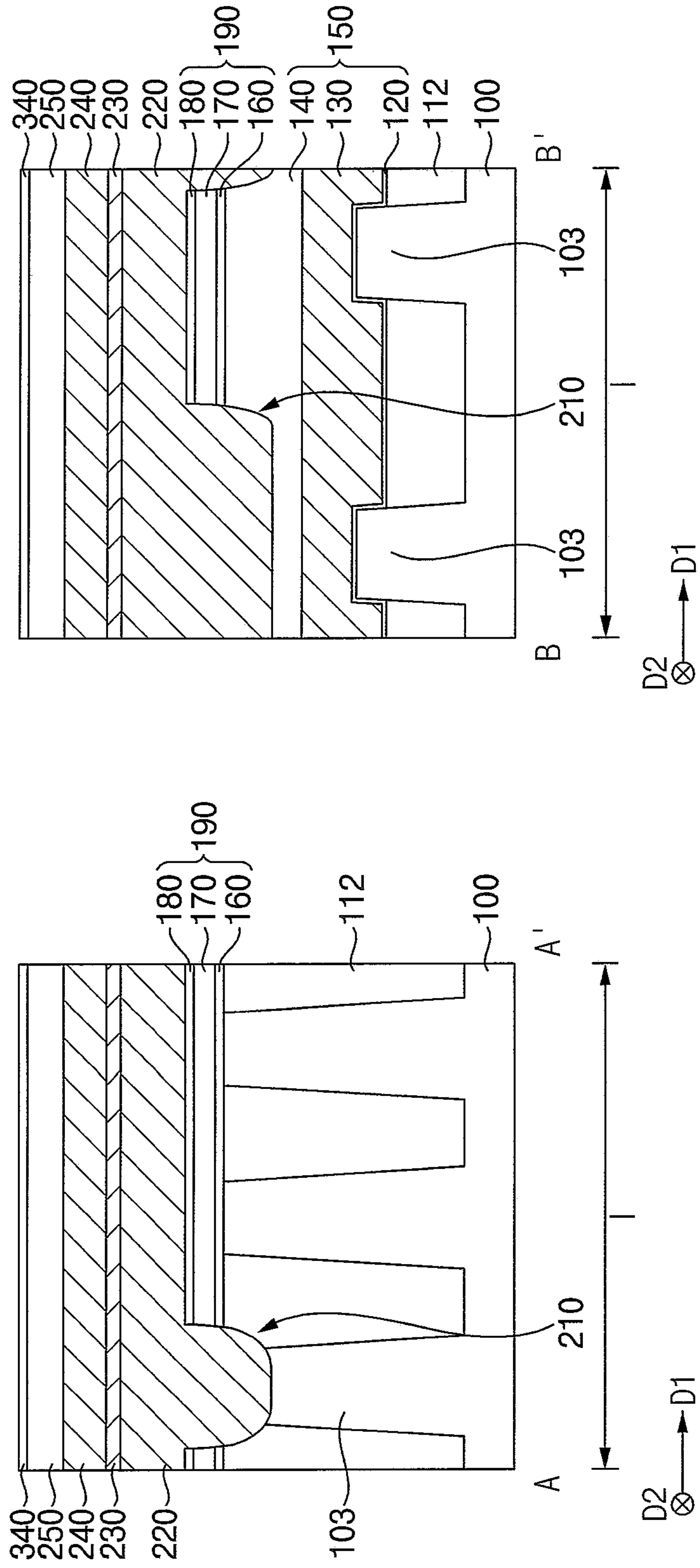
Figure 12:
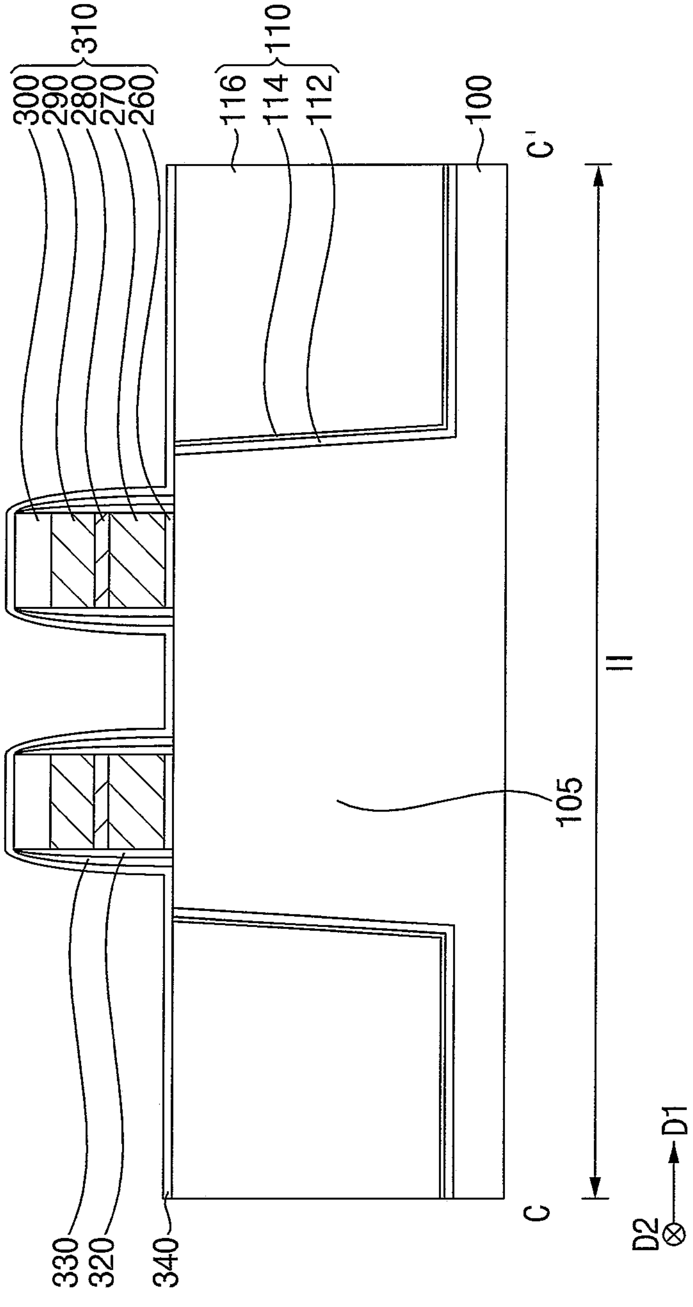

Referring to FIGS. 10 to 12, the conductive structure layer may be patterned to form a second gate structure 310 on the second region II of the substrate 100.

The second gate structure 310 may include a second gate insulation pattern 260, a first conductive pattern 270, a first barrier pattern 280, a second conductive pattern 290 and a second gate mask 300 sequentially stacked in a vertical direction substantially perpendicular to an upper surface of the substrate 100, and the first conductive pattern 270, the first barrier pattern 280 and the second conductive pattern 290 may form a second gate electrode.

The second gate structure 310 may partially overlap the second active pattern 105 in the vertical direction on the second region II of the substrate 100.

First and second gate spacers 320 and 330 may be formed on a sidewall of the second gate structure 310 sequentially stacked in a horizontal direction substantially parallel to the upper surface of the substrate 100.

The first gate spacer 320 may be formed by forming a first spacer layer on the substrate 100 to cover the conductive structure layer and the second gate structure 310 and anisotropically etching the first spacer layer. The second gate spacer 330 may be formed by forming a second spacer layer on the substrate 100 to cover the conductive structure layer, the second gate structure 310 and the first gate spacer 320 and anisotropically etching the second spacer layer.

The first gate spacer 320 may include or be formed of a nitride, e.g., silicon nitride, and the second gate spacer 330 may include or be formed of an oxide, e.g., silicon oxide.

A first etch stop layer 340 may be formed on the substrate 100 to cover the conductive structure layer, the second gate structure 310, the second gate spacer 330 and the isolation pattern structure 110. The first etch stop layer 340 may include or be formed of a nitride, e.g., silicon nitride.

Figure 13:
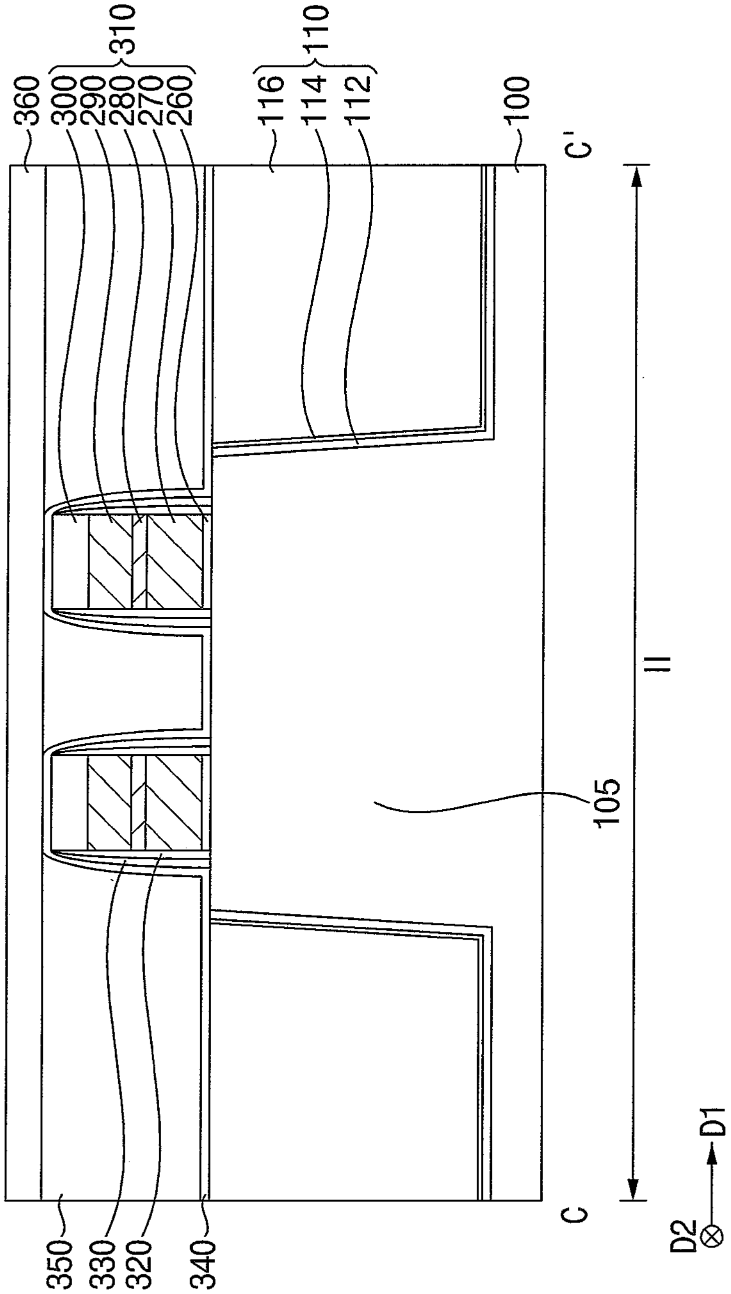

Referring to FIG. 13, a first insulating interlayer 350 may be formed on the first etch stop layer 340 to a sufficient height, and may be planarized until an upper surface of the second gate structure 310 and an upper surface of a portion of the first etch stop layer 340 on the conductive structure layer are exposed.

Additionally, a first capping layer 360 may be formed on the first insulating interlayer 350 and the first etch stop layer 340.

The first insulating interlayer 350 may include or be formed of an oxide, e.g., silicon oxide, and the first capping layer 360 may include or be formed of a nitride, e.g., silicon nitride.

Figure 14:
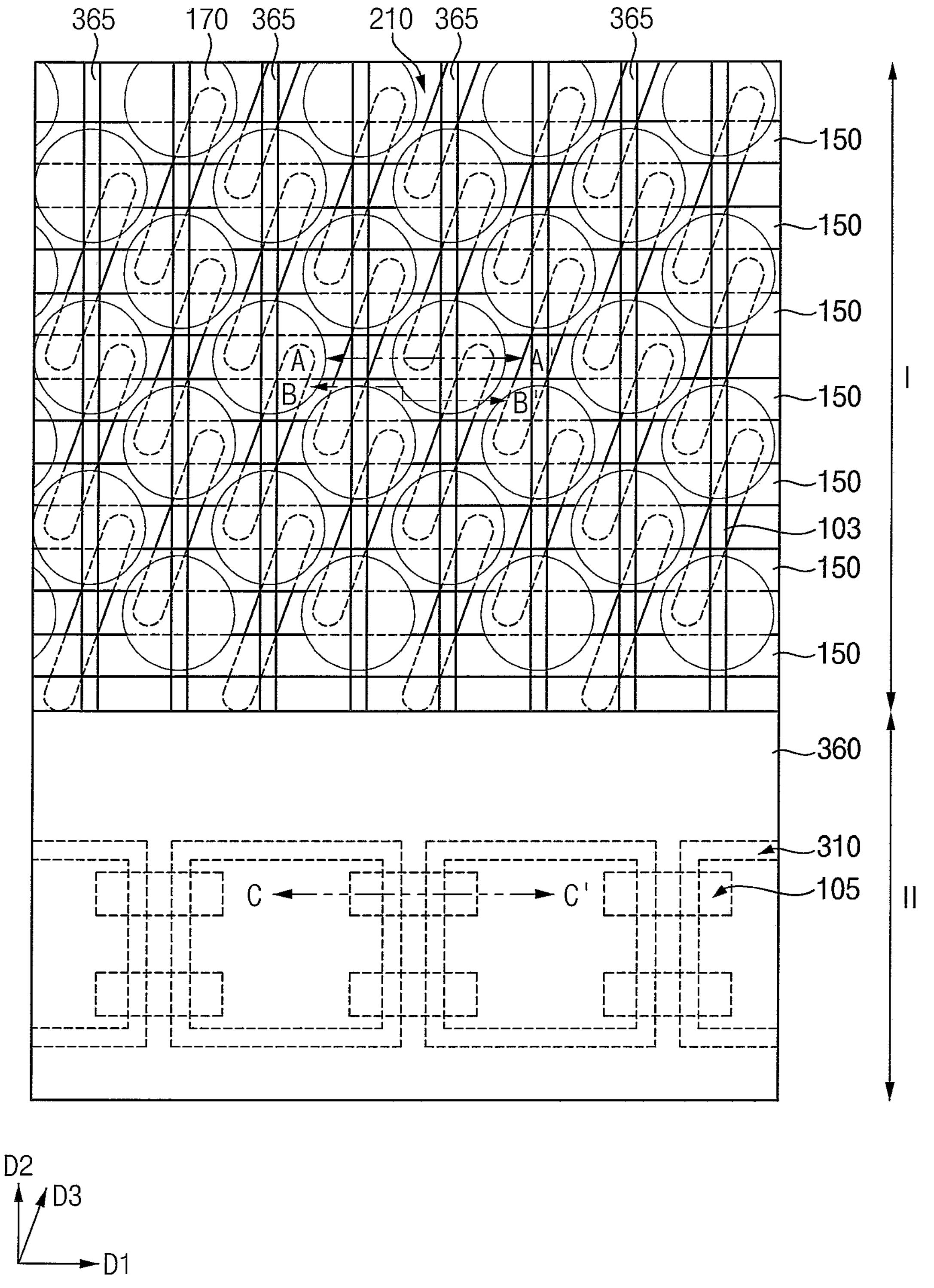
Figure 15:
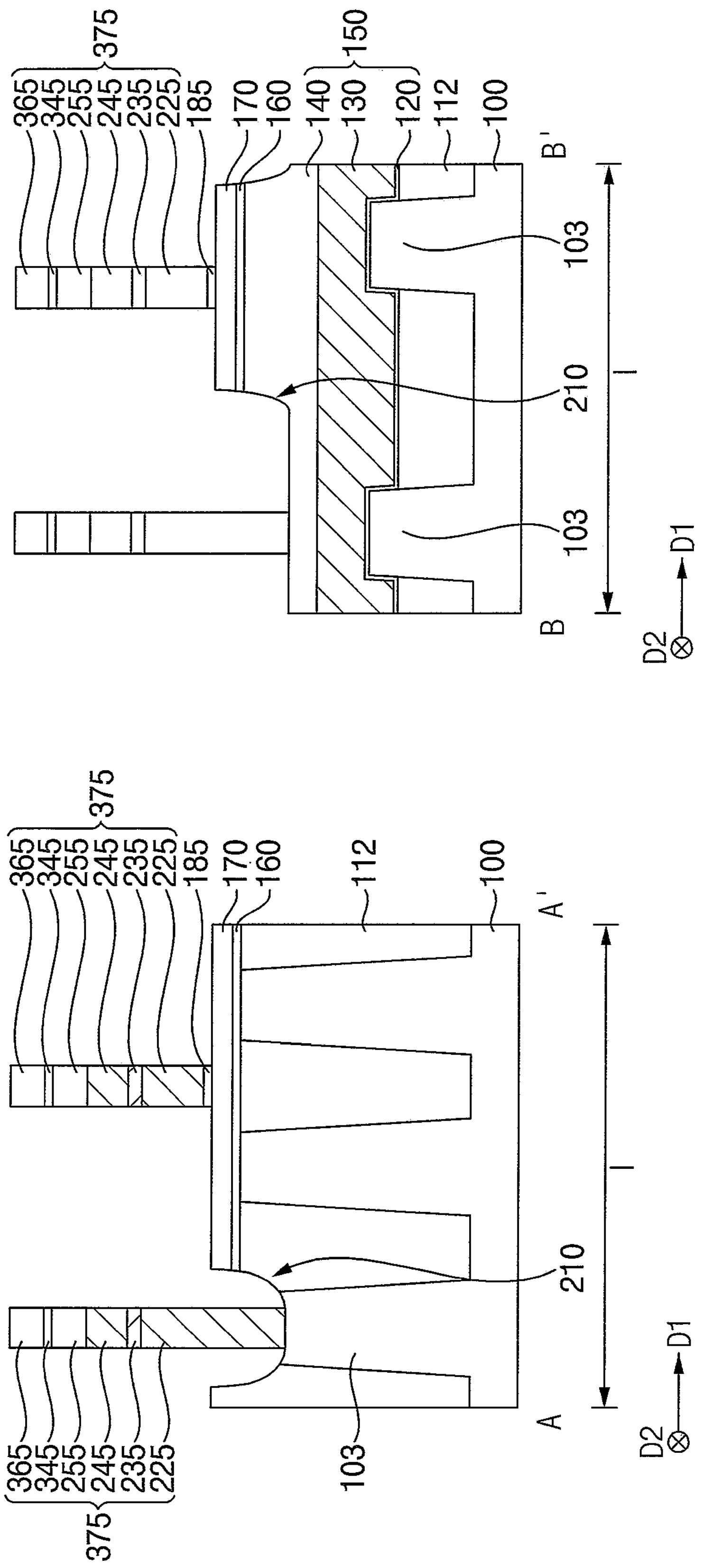

Referring to FIGS. 14 and 15, a portion of the first capping layer 360 on the first region I of the substrate 100 may be etched to form a first capping pattern 365, and the first etch stop layer 340, the first mask layer 250, the second conductive layer 240, the first barrier layer 230 and the first conductive layer 220 may be sequentially etched using the first capping pattern 365 as an etching mask.

In example embodiments, the first capping pattern 365 may extend in the second direction D2 on the first region I of the substrate 100, and a plurality of first capping patterns 365 may be formed to be spaced apart from each other in the first direction D1. The first capping layer 360 may remain on the second region II of the substrate 100.

By the etching process, on the first region I of the substrate 100, a third conductive pattern 225, a second barrier pattern 235, a fourth conductive pattern 245, a first mask 255, a first etch stop pattern 345 and the first capping pattern 365 may be sequentially stacked on the first opening 210, and a third insulation pattern 185, the third conductive pattern 225, the second barrier pattern 235, the fourth conductive pattern 245, the first mask 255, the first etch stop pattern 345 and the first capping pattern 365 may be sequentially stacked on the second insulation layer 170 of the insulation layer structure 190 at an outside of the first opening 210.

Hereinafter, the third conductive pattern 225, the second barrier pattern 235, the fourth conductive pattern 245, the first mask 255, the first etch stop pattern 345 and the first capping pattern 365 sequentially stacked may be referred to as a bit line structure 375. In example embodiments, the bit line structure 375 may extend in the second direction D2 on the first region I of the substrate 100, and a plurality of bit line structures 375 may be spaced apart from each other in the first direction D1.

Figure 16:
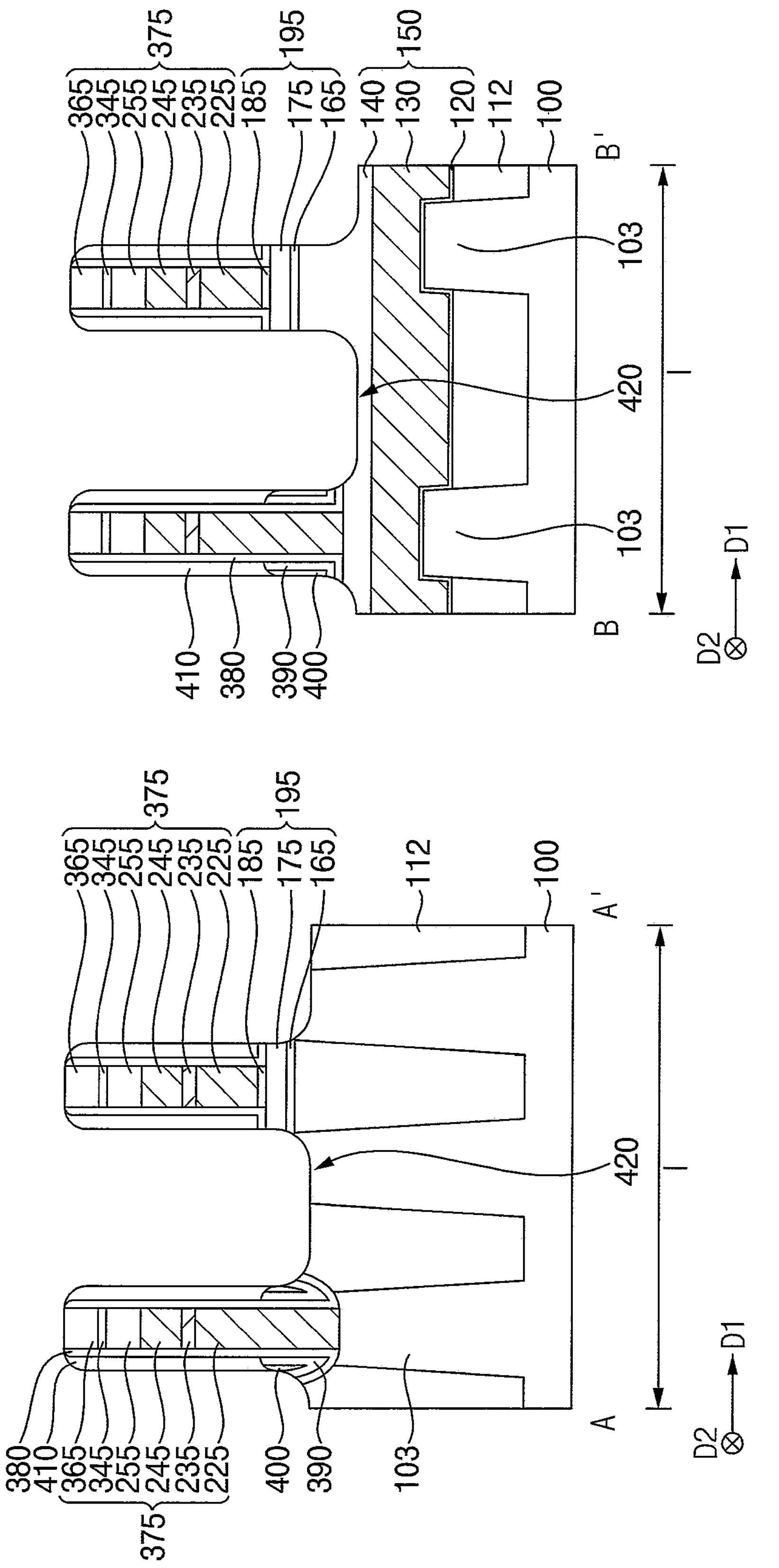

Referring to FIG. 16, a third spacer layer may be formed on the substrate 100 to cover the bit line structure 375, and fourth and fifth insulation layers may be sequentially formed on the third spacer layer.

The third spacer layer may also cover a sidewall of the third insulation pattern 185 between the second insulation layer 170 and the bit line structure 375, and the fifth insulation layer may fill the first opening 210.

The third spacer layer may include or be formed of a nitride, e.g., silicon nitride, the fourth insulation layer may include or be formed of an oxide, e.g., silicon oxide, and the fifth insulation layer may include or be formed of a nitride, e.g., silicon nitride.

The fourth and fifth insulation layers may be etched by an etching process. In example embodiments, the etching process may be performed by a wet etch process using an etching solution including phosphorous acid ($H_3PO_4$), SC1, hydrogen fluoride (HF), and other portions of the fourth and fifth insulation layers except for a portion in the first opening 210 may be removed. Thus, most of an entire surface of the third spacer layer, that is, an entire surface except for a portion thereof in the first opening 210 may be exposed, and portions of the fourth and fifth insulation layers remaining in the first opening 210 may form fourth and fifth insulation patterns 390 and 400, respectively.

A fourth spacer layer may be formed on the exposed surface of the third spacer layer and the fourth and fifth insulation patterns 390 and 400 in the fifth opening 210, and may be anisotropically etched to form a fourth spacer 410 on the surface of the third spacer layer and the fourth and fifth insulation patterns 390 and 400 to cover a sidewall of the bit line structure 375. The fourth spacer layer may include or be formed of an oxide, e.g., silicon oxide.

A dry etching process may be performed using the first capping pattern 365 and the fourth spacer 410 as an etching mask to form a second opening 420 exposing the upper surface of the first active pattern 103. The upper surface of the isolation pattern structure 110 and the upper surface of the first gate mask 140 may be also exposed by the second opening 420.

By the dry etching process, portions of the third spacer layer on upper surfaces of the first capping pattern 365 and the second insulation layer 170 may be removed, and thus a third spacer 380 covering the sidewall of the bit line structure 375 may be formed. Additionally, during the dry etching process, the first and second insulation layers 160 and 170 may be partially removed, such that first and second insulation patterns 165 and 175 may remain under the bit line structure 375. The first to third insulation patterns 165, 175 and 185 that are sequentially stacked under the bit line structure 375 may form an insulation pattern structure 195.

Figure 17:
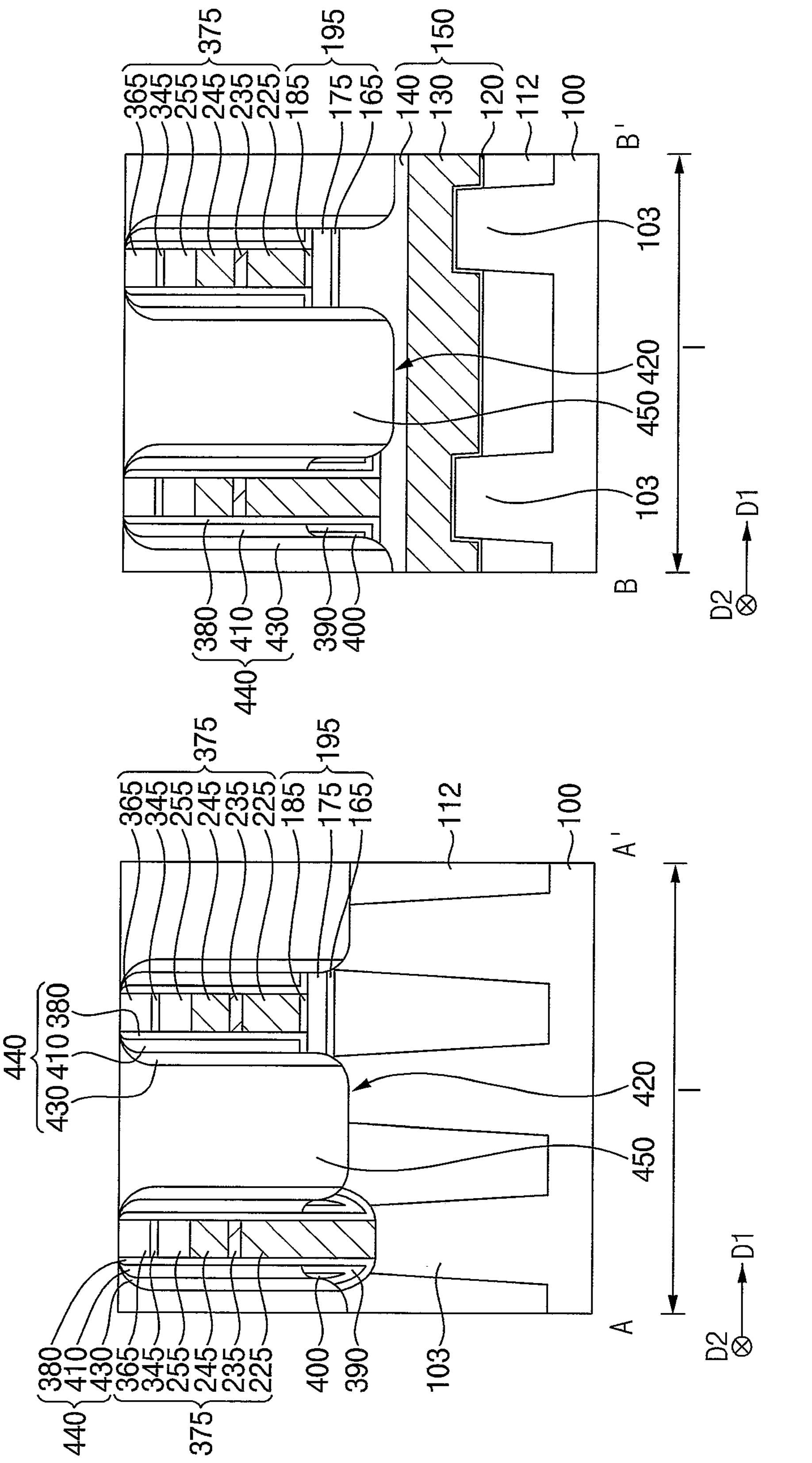

Referring to FIG. 17, a fifth spacer layer may be formed on the upper surface of the first capping pattern 365, an outer sidewall of the fourth spacer 410, portions of upper surfaces of the fourth and fifth insulation patterns 390 and 400, and the upper surfaces of the first active pattern 103, the isolation pattern structure 110 and the first gate mask 140 exposed by the second opening 420, and may be anisotropically etched to form a fifth spacer 430 covering the sidewall of the bit line structure 375. The fifth spacer layer may include or be formed of a nitride, e.g., silicon nitride.

The third to fifth spacers 380, 410 and 430 sequentially stacked in the horizontal direction from the sidewall of the bit line structure 375 on the first region I of the substrate 100 may be referred to as a preliminary spacer structure 440.

A second capping layer may be formed on the first region I of the substrate 100 to fill the second opening 420, and may be planarized until the upper surface of the first capping pattern 365 is exposed to form a second capping pattern 450. In example embodiments, the second capping pattern 450 may extend in the second direction D2, and a plurality of second capping patterns 450 may be spaced apart from each other in the first direction D1 by the bit line structures 375.

Figure 18:
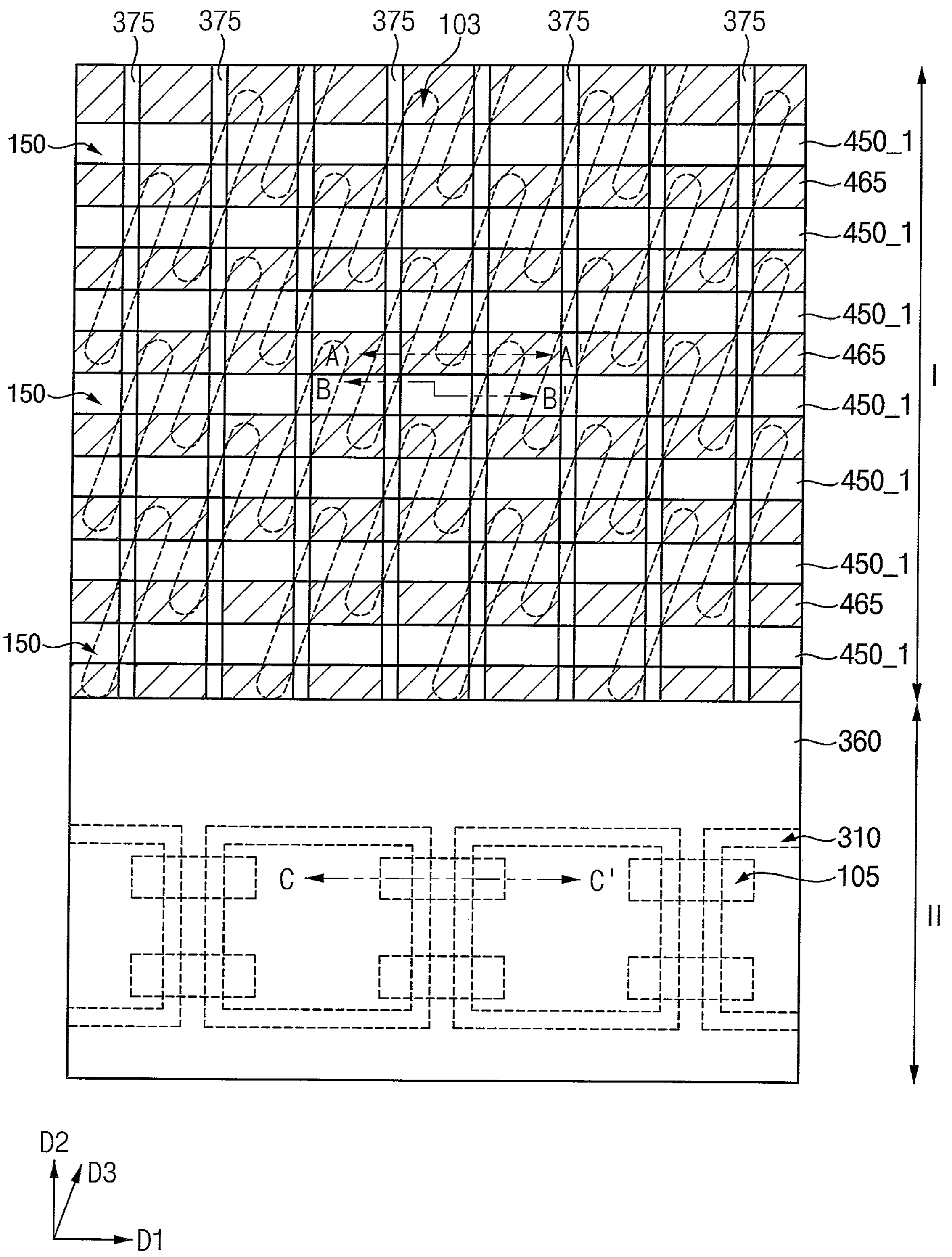
Figure 19:
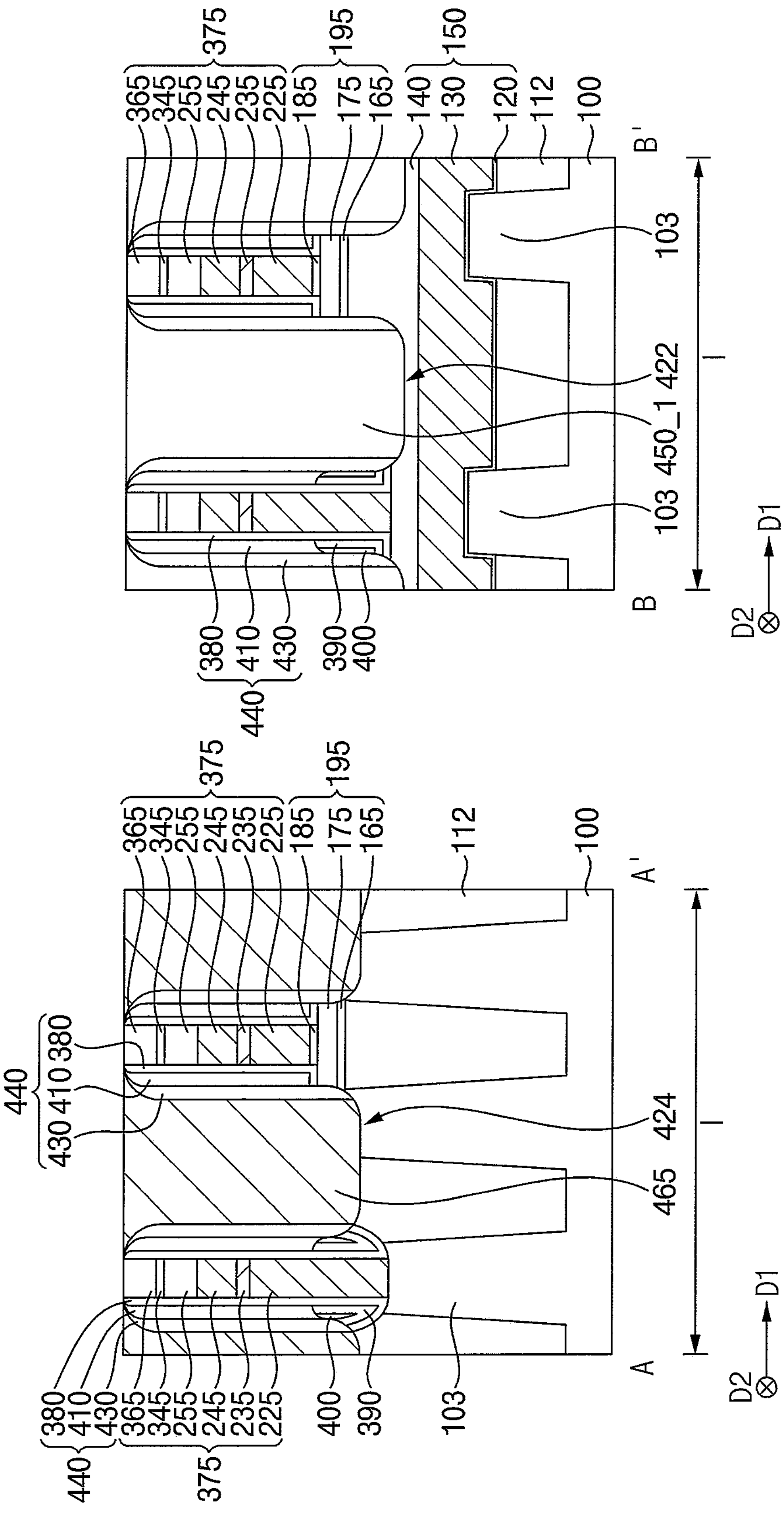

Referring to FIGS. 18 and 19, a second mask (not shown) including a plurality of third openings, each of which may extend in the first direction D1, spaced apart from each other in the second direction D2 may be formed on the first and second capping patterns 365 and 450, and the second capping pattern 450 on the first gate structure 150 may be etched using the second mask as an etching mask.

In example embodiments, each third opening may overlap the first gate structure 150 in the vertical direction. A third capping layer may be formed on the first region I of the substrate 100 to fill a third opening 422, and may be planarized until the upper surface of the first capping pattern 365 is exposed to form a third capping pattern 450_1. In example embodiments, the third capping pattern 450_1 may extend in the second direction D2, and a plurality of third capping patterns 450_1 may be spaced apart from each other in the first direction D1 by the bit line structures 375. By the etching process, the third opening 422 that may expose an upper surface of the first gate mask 140 of the first gate structure 150 between the bit line structures 375 may be formed on the first region I of the substrate 100.

In example embodiments, the etching process may be performed by a wet etch process and the second capping pattern 450 in the second opening 420 may be removed. A dry etching process may be additionally performed using the first capping pattern 365 and the fifth spacer 430 as an etching mask to form a fourth opening 424 exposing the upper surface of the first active pattern 103 and the upper surface of the first isolation pattern 112.

A lower contact plug layer may be formed to fill the fourth opening 424, and an upper portion of the lower contact plug layer may be planarized until the upper surfaces of the first capping pattern 365 is exposed to form a lower contact plug 465. In example embodiments, the lower contact plug layer may be divided into a plurality of lower contact plugs 465, each of which may extend in the first direction D1, spaced apart from each other in the second direction D2. Additionally, the third capping pattern 450_1 extending in the second direction D2 between the bit line structures 375 may be divided into a plurality of pieces spaced apart from each other in the second direction D2.

The lower contact plug layer may include or be formed of, e.g., doped polysilicon.

Figure 20:
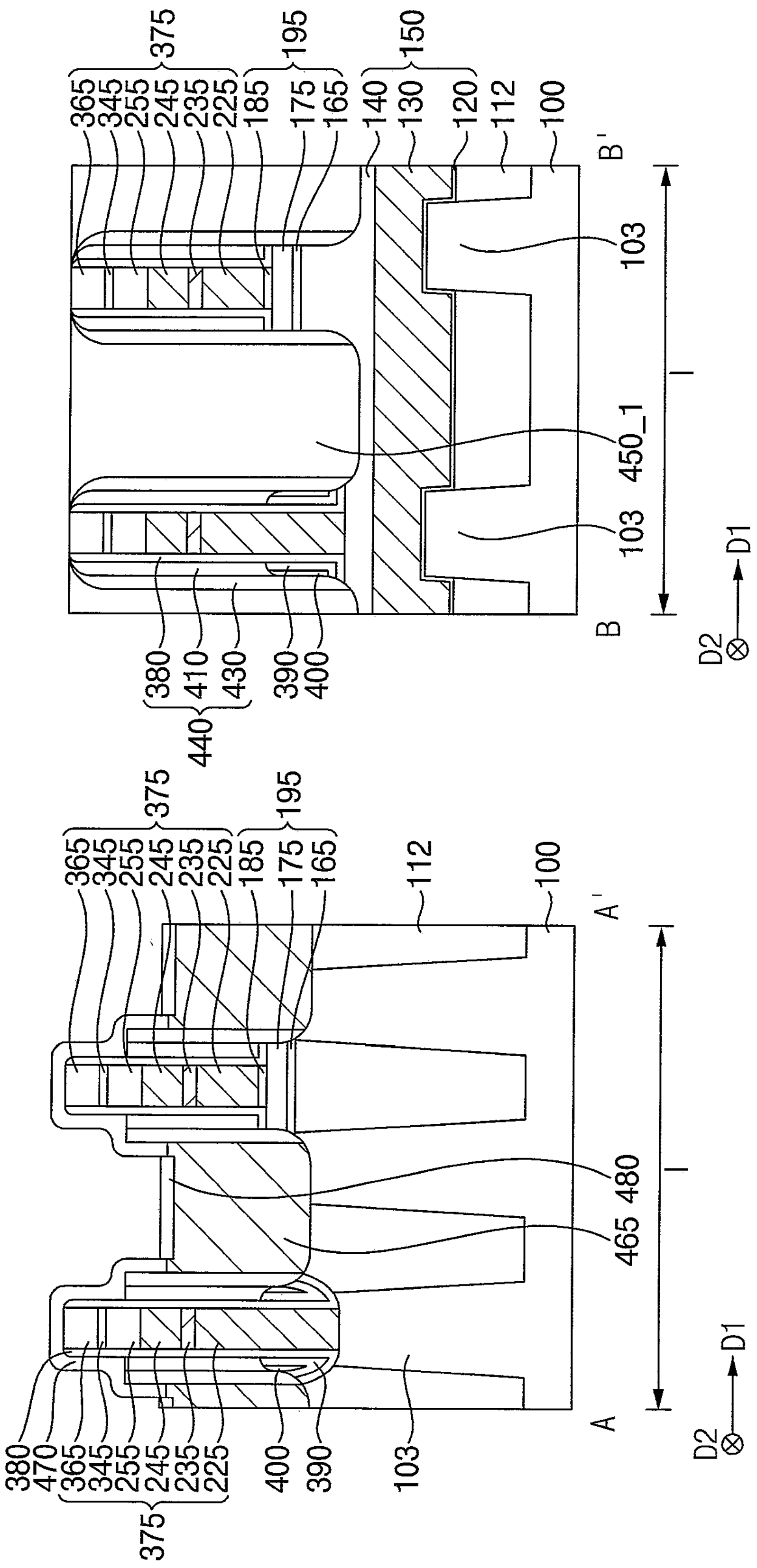

Referring to FIG. 20, an upper portion of the lower contact plug 465 may be removed to expose an upper portion of the preliminary spacer structure 440 on the sidewall of the bit line structure 375, and upper portions of the fourth and fifth spacers 410 and 430 of the exposed preliminary spacer structure 440 may be removed.

An etch back process may be further performed to remove an upper portion of the lower contact plug 465. Thus, the upper surface of the lower contact plug 465 may be lower than uppermost surfaces of the fourth and fifth spacers 410 and 430.

A sixth spacer layer may be formed on the bit line structure 375, the preliminary spacer structure 440, the third capping pattern 450_1, and the lower contact plug 465, and may be anisotropically etched so that a sixth spacer 470 may be formed to cover the an upper portion of the preliminary spacer structure 440 on each of opposite sidewalls of the bit line structure 375 in the first direction D1 and that an upper surface of the lower contact plug 465 may not be covered by the sixth spacer 470 but be exposed.

A metal silicide pattern 480 may be formed on the exposed upper surface of the lower contact plug 465. In example embodiments, the metal silicide patterns 480 may be formed by forming a first metal layer on the first and third capping patterns 365 and 450_1, the sixth spacer 470 and the lower contact plug 465, thermally treating the first metal layer, and removing an unreacted portion of the first metal layer. The metal silicide pattern 480 may include or be formed of, e.g., cobalt silicide, nickel silicide, titanium silicide, etc.

Figure 21:
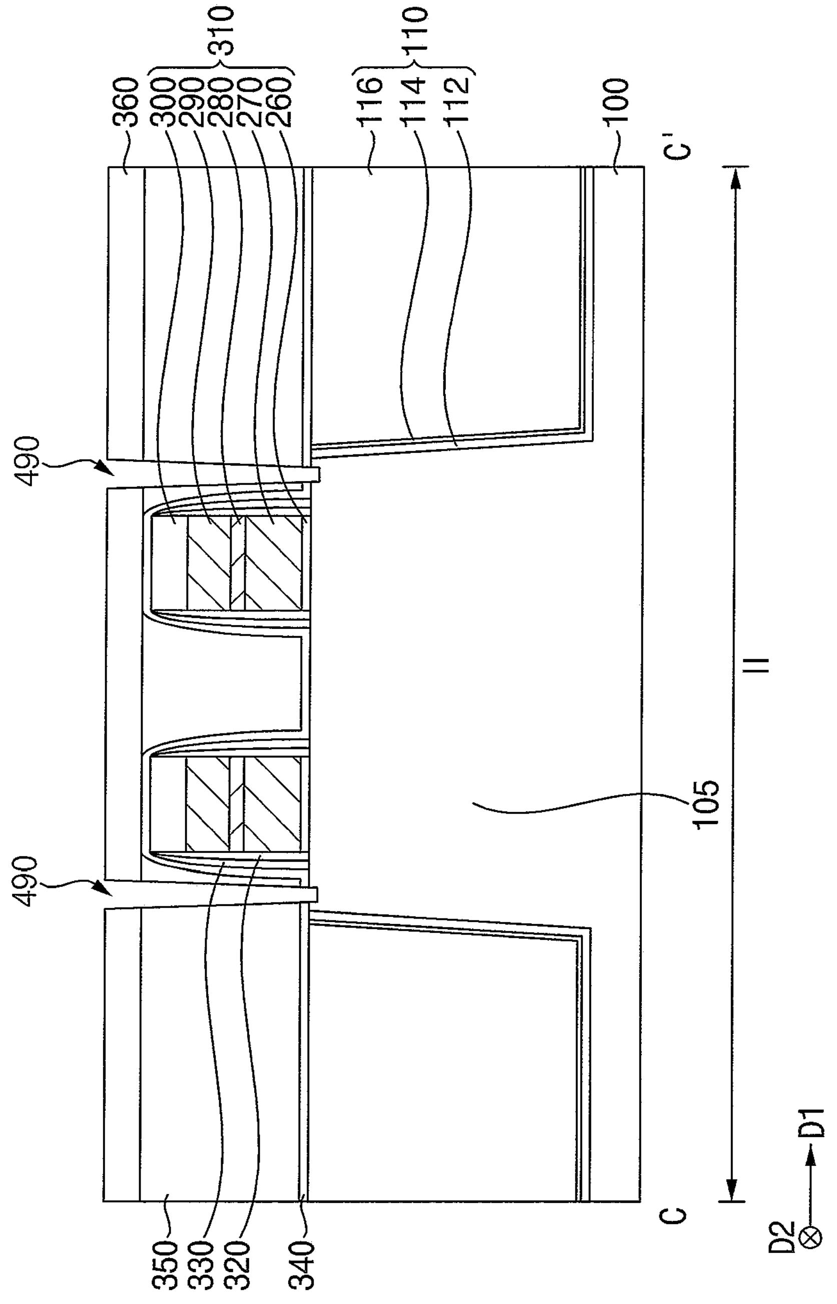

Referring to FIG. 21, a fifth opening 490 may be formed through the first capping layer 360, the first insulating interlayer 350 and the first etch stop layer 340 on the second region II of the substrate 100 to expose the second active pattern 105.

In example embodiments, p-type impurities or n-type impurities may be doped into an upper portion of the second active pattern 105 through the fifth opening 490 to form an impurity region.

Figure 22:
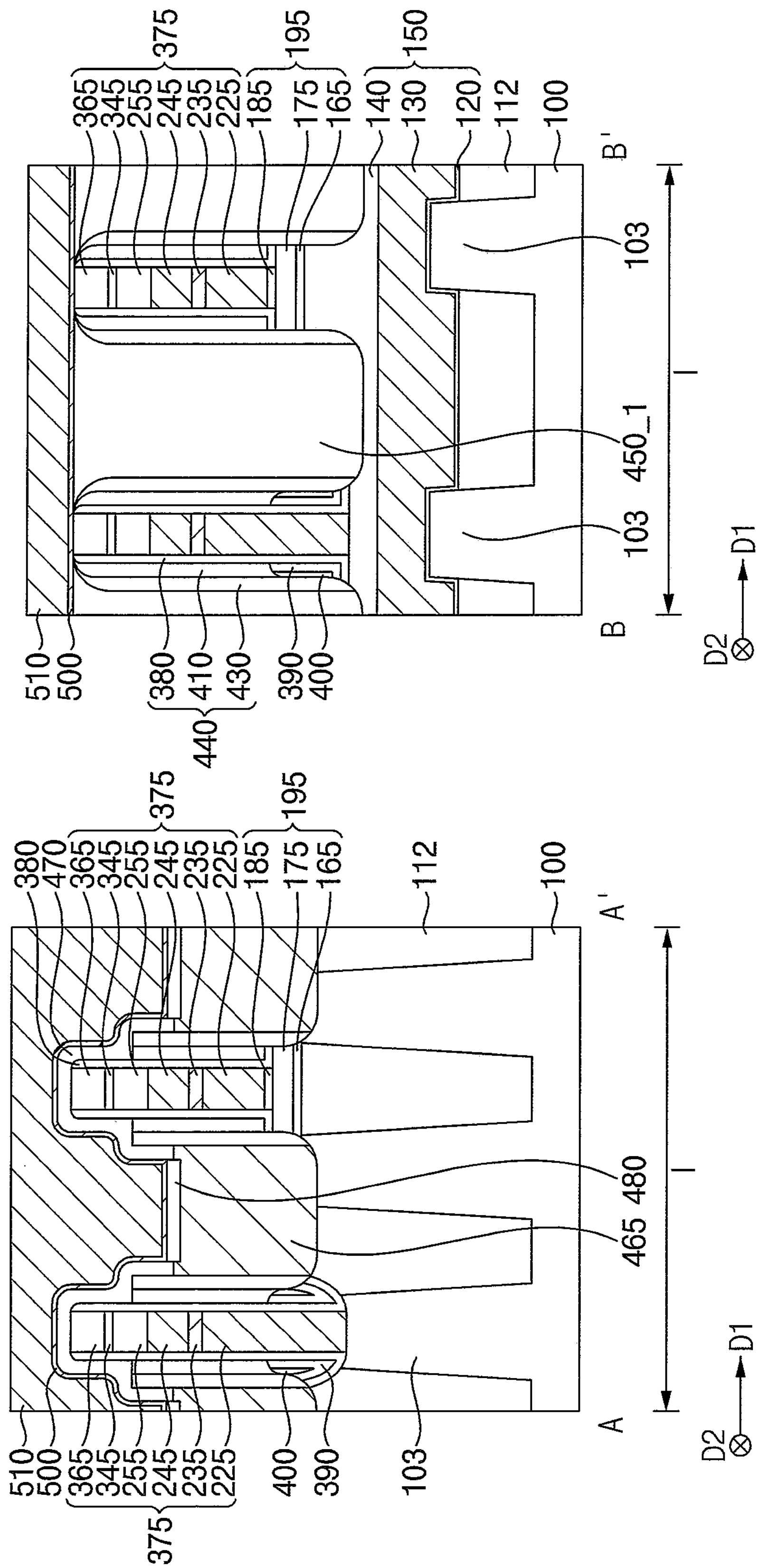
Figure 23:
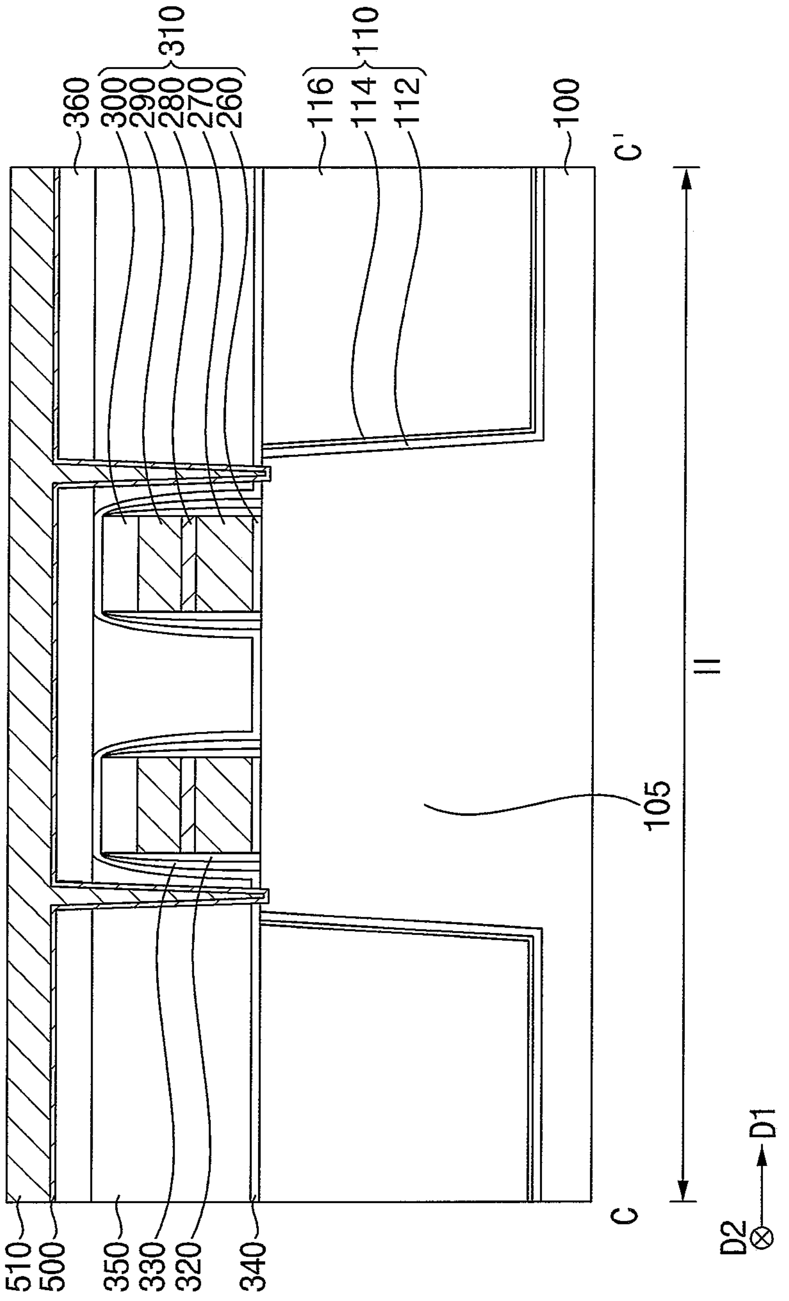

Referring to FIGS. 22 and 23, a second barrier layer 500 may be formed on the first and third capping patterns 365 and 450_1, the sixth spacer 470, the metal silicide pattern 480 and the lower contact plug 465 on the first region I of the substrate 100, and the first capping layer 360, a sidewall of the fifth opening 490 and the exposed upper surface of the second active pattern 105 on the second region II of the substrate 100, and a second metal layer 510 may be formed on the fifth barrier layer 500 to fill the fifth opening 490.

A planarization process may be further performed on the second metal layer 510. The planarization process may include, e.g., chemical mechanical polishing (CMP) process and/or an etch back process.

Figure 24:
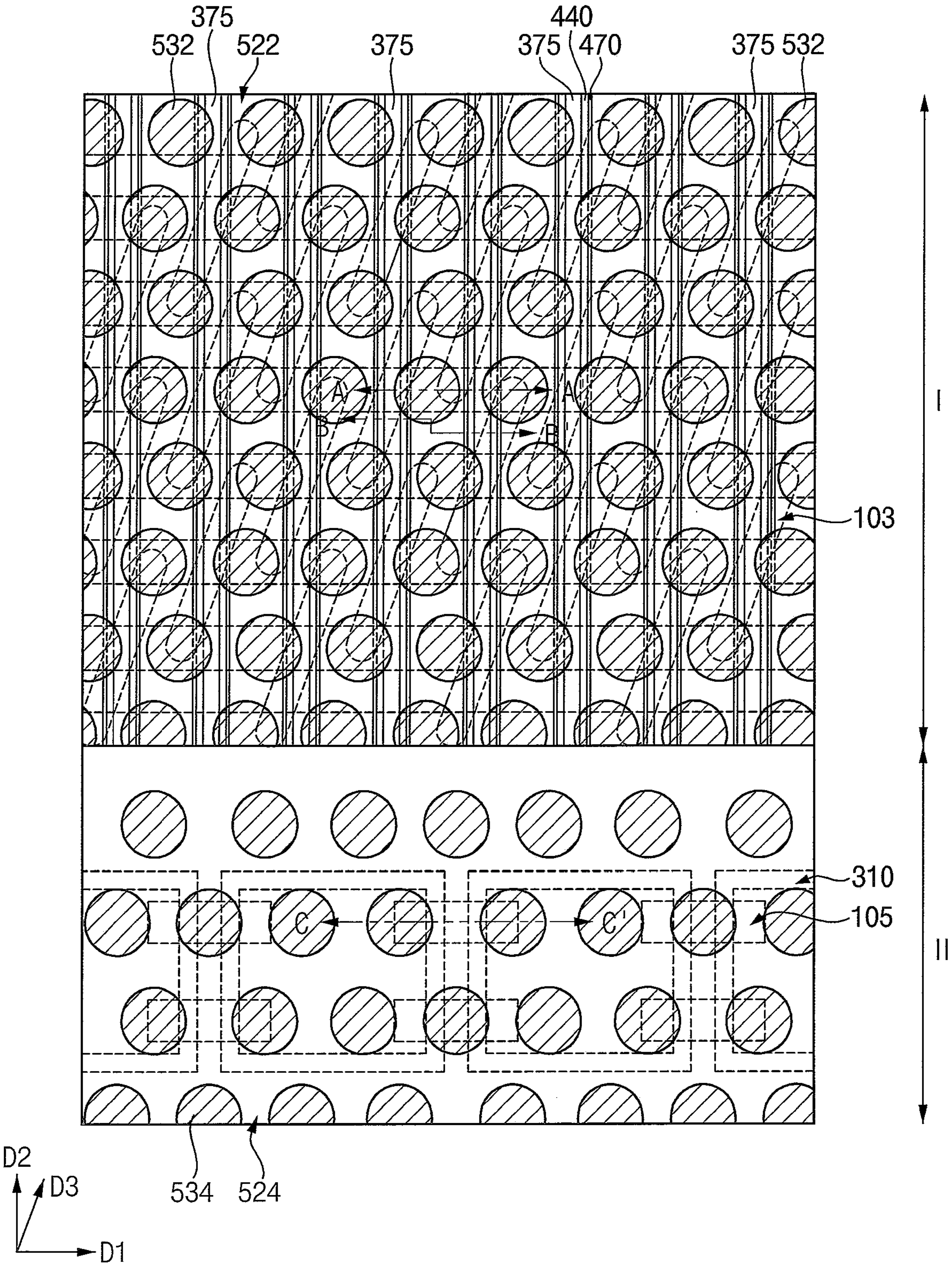
Figure 25:
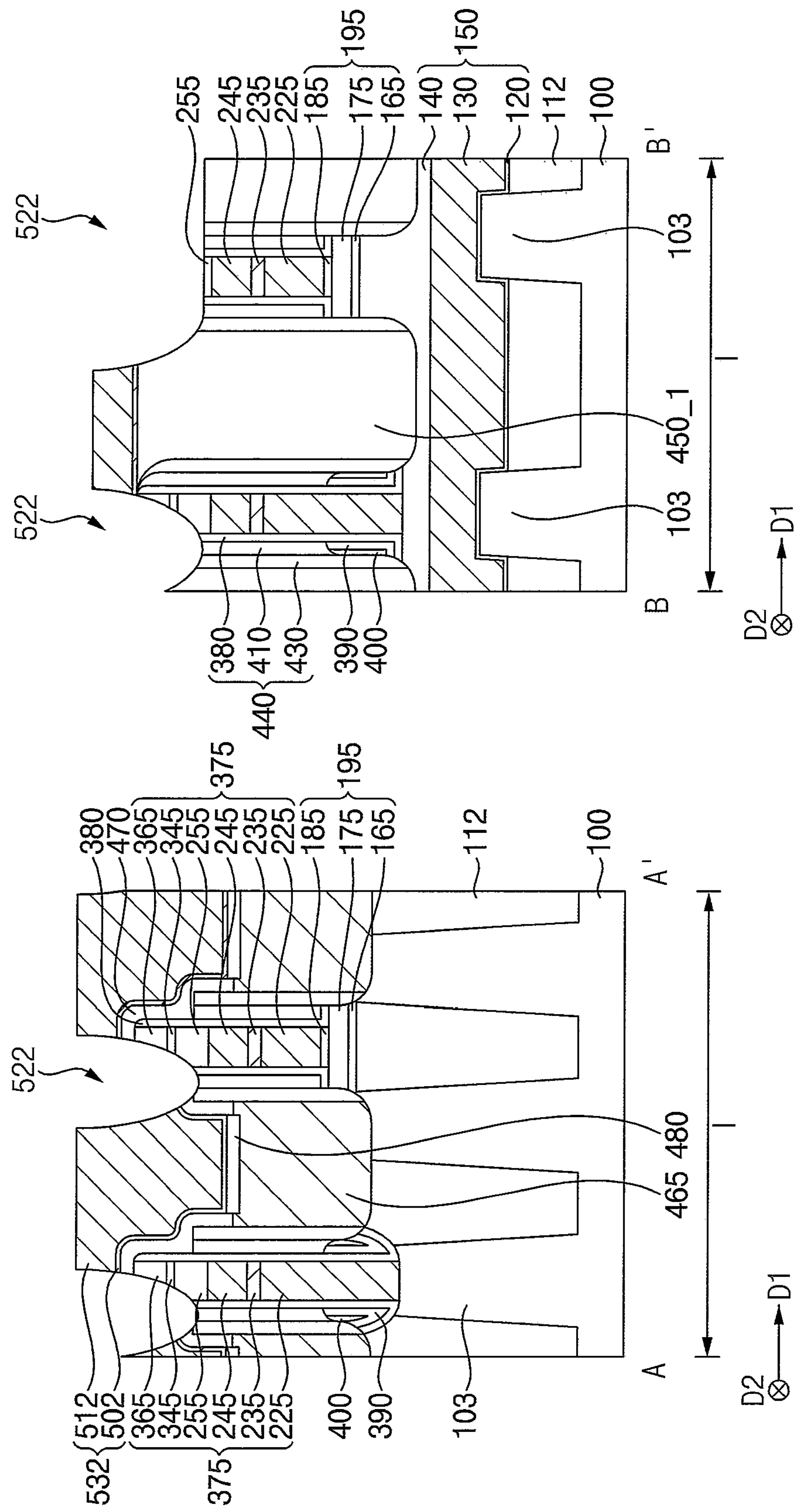
Figure 26:
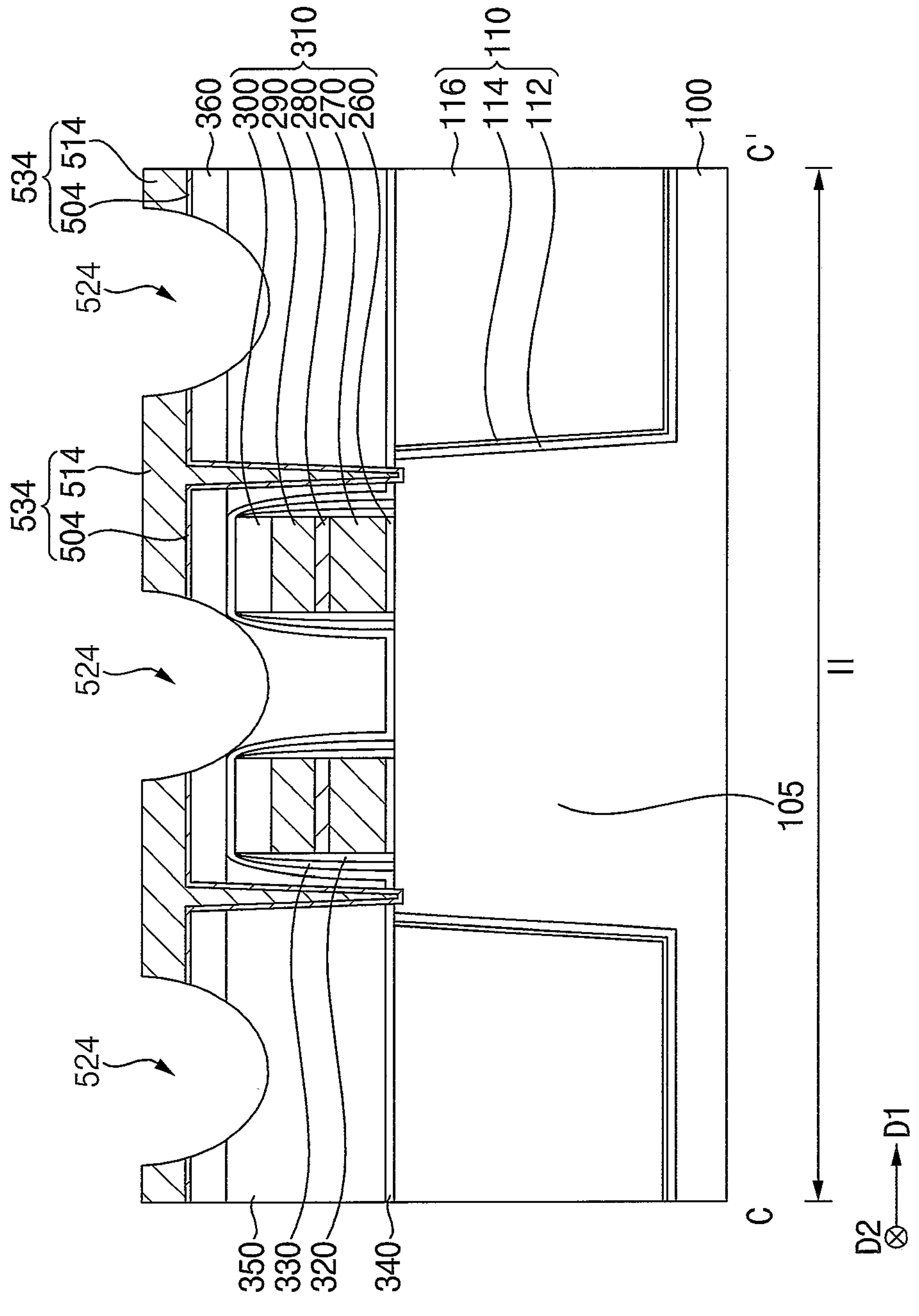

Referring to FIGS. 24 to 26, the second metal layer 510 and the second barrier layer 500 may be patterned.

Thus, an upper contact plug 532 may be formed on the first region I of the substrate 100, and a wiring 534 may be formed on the second region II of the substrate 100. A sixth opening 522 may be formed between the upper contact plugs 532, and a seventh opening 524 may be formed between the wirings 534. A width of the seventh opening 524 in the horizontal direction may be greater than a width of the sixth opening 522 in the horizontal direction.

During the formation of the sixth opening 522, the first and third capping patterns 365 and 450_1, the first etch stop pattern 345, the first mask 255 and the preliminary spacer structure 440 may be also partially removed to expose an upper surface of the fourth spacer 410. During the formation of the seventh opening 524, the first capping layer 360 and the first insulating interlayer 350 may be also partially removed.

As the sixth opening 522 is formed, the second metal layer 510 and the second barrier layer 500 on the first region I of the substrate 100 may be transformed into a first metal pattern 512 and a third barrier pattern 502 covering a lower surface of the first metal pattern 512, which may form the upper contact plug 532.

The lower contact plug 465, the metal silicide pattern 480 and the upper contact plug 532 sequentially stacked on the first region I of the substrate 100 may form a contact plug structure.

The wiring 534 may include a second metal pattern 514 and a fourth barrier pattern 504 covering a lower surface of the second metal pattern 514.

In example embodiments, a plurality of upper contact plugs 532 may be spaced apart from each other in each of the first and second directions D1 and D2, which may be arranged in a honeycomb pattern in a plan view. Additionally, a plurality of wirings 534 may be formed in each of the first and second directions D1 and D2. Each of the upper contact plugs 532 and each of the wirings 534 may have a shape of a circle, an ellipse, a polygon, etc., in a plan view.

Figure 27:
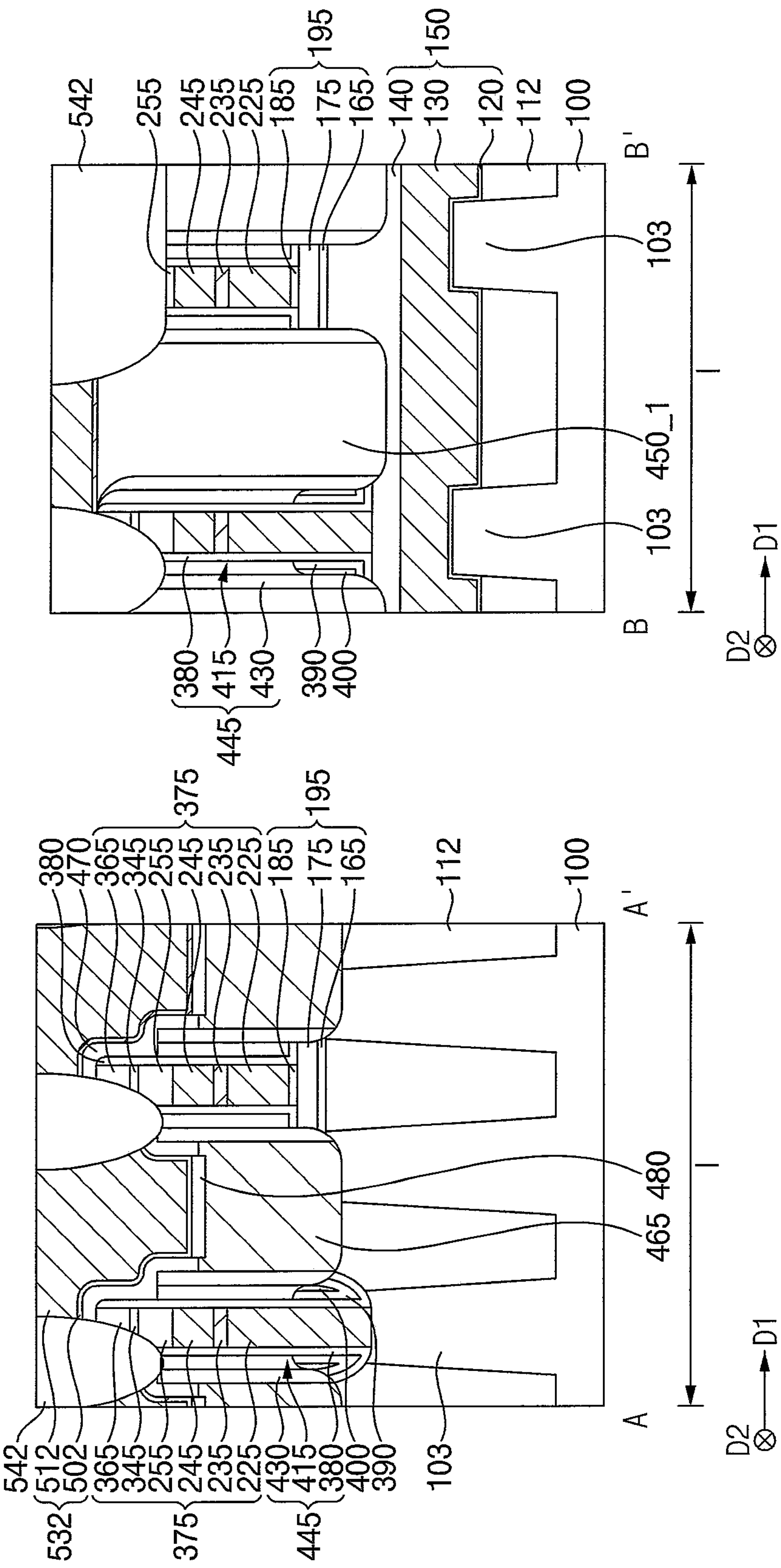
Figure 28:
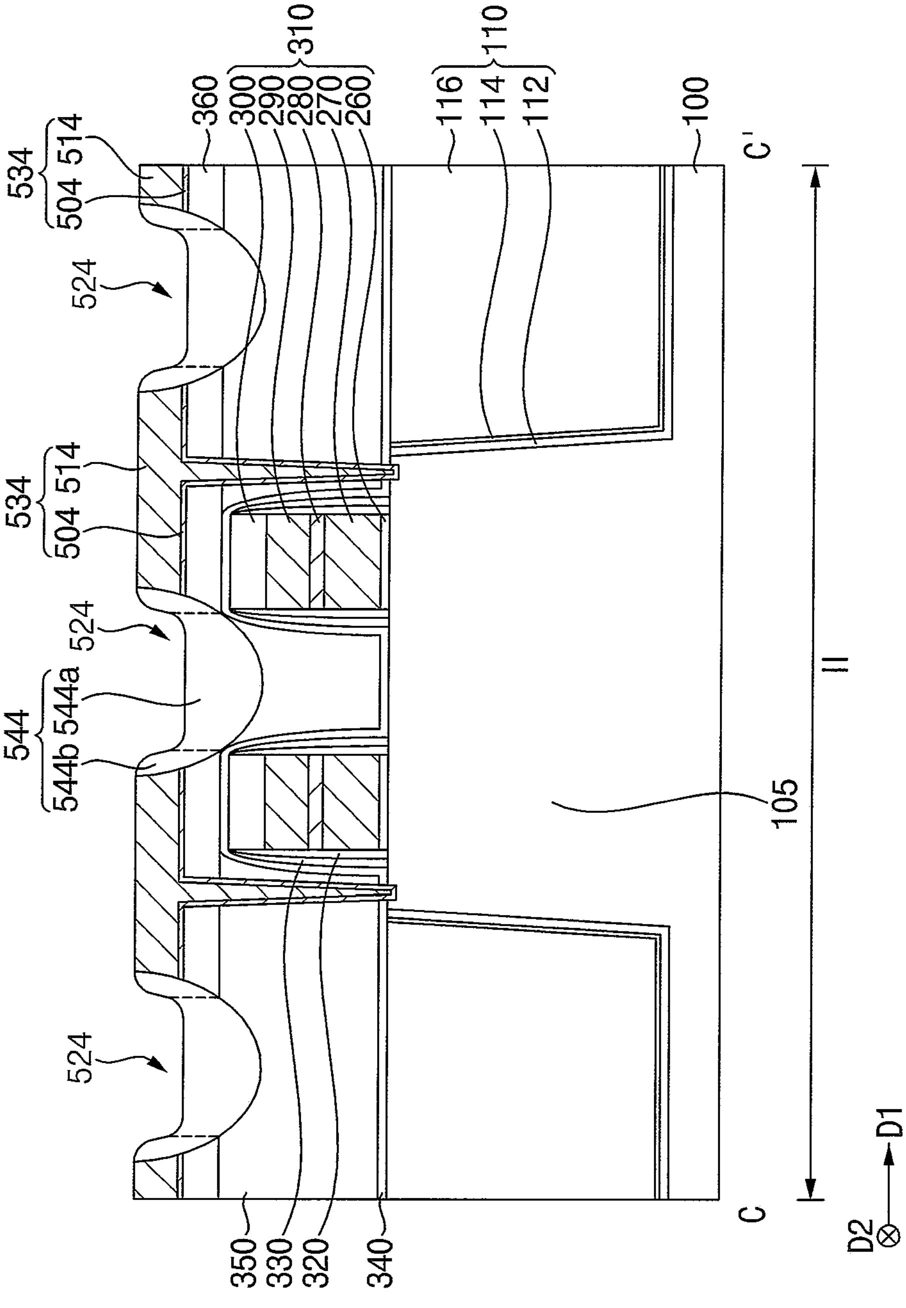

Referring to FIGS. 27 and 28, the exposed fourth spacer 410 may be removed to form an air gap 415 connected to the sixth opening 522. The fourth spacer 410 may be removed by, e.g., a wet etching process.

In example embodiments, not only a portion of the fourth spacer 410 on the sidewall of the bit line structure 375 extending in the second direction D2 directly exposed by the sixth opening 522 but also other portions of the fourth spacer 410 parallel to the directly exposed portion thereof in the horizontal direction may be removed. For example, not only the portion of the fourth spacer 410 exposed by the sixth opening 522 not to be covered by the upper contact plug 532 but also a portion of the fourth spacer 410 covered by the upper contact plug 532 may be all removed.

A sixth insulation layer may be formed on the sixth and seventh openings 522 and 524, the contact plug structure and the wiring 534 by a deposition process, and may be anisotropically etched to form sixth and seventh insulation patterns 542 and 544 in the sixth and seventh openings 522 and 524, respectively.

A width in the horizontal direction of the seventh opening 524 between the contact plug structures may be greater than a width in the horizontal direction of the sixth opening 522 between the wirings 534, and thus the sixth insulation pattern 542 may entirely fill the sixth opening 522, while the seventh insulation pattern 544 may partially fill the seventh opening 524.

In example embodiments, the deposition process may be performed by an atomic layer deposition (ALD) process. The ALD process may include a step of providing a precursor of the sixth insulation layer, a step of purging the precursor of the sixth insulation layer, a step of providing a reactant of the sixth insulation layer, a step of purging the reactant of the sixth insulation layer, and a step of providing a deposition inhibitor on the contact plug structure and the wiring 534, and the steps may be repeatedly performed until the sixth insulation layer may be formed on the contact plug structure and the wiring 534. Thus, the sixth insulation layer may have an upper surface on the sixth opening 522 higher than an upper surface of the contact plug structure, a thick thickness in the vertical direction on a bottom of the seventh opening 524, and a thin thickness in the horizontal direction on a sidewall of the seventh opening 524 and on the contact plug structure and the wiring 534. In an example embodiment, the deposition inhibitor may include or be formed of, e.g., ammonia ($NH_3$), nitrogen ($N_2$) and/or nitron fluorine three ($NF_3$).

In example embodiments, the anisotropic etching process may be performed by an etch back process. During the etch back process, an upper portion of the sixth insulation layer on the sixth opening 522, an upper portion of the sixth insulation layer on the bottom of the seventh opening 524, and a portion of the contact plug structure and the wiring 534 may be removed. Thus, upper surfaces of the contact plug structure and the wiring 534 may be exposed, a sixth insulation pattern 542 filling the sixth opening 522 may be formed, and a seventh insulation pattern 544 including a lower portion **544*a* on the bottom of the seventh opening 524 and a lateral portion 544*b* contacting the sidewall of the seventh opening 524 may be formed. Additionally, a thickness of the lower portion 544*a* in the vertical direction from the bottom of the seventh opening 524 may be greater than a thickness of the lateral portion 544*b* in the horizontal direction from the sidewall of the seventh opening 524**.

In example embodiments, the deposition process and the anisotropic etching process may be performed in-situ, and thus the process margin may be enhanced.

The sixth insulation layer may include or be formed of, e.g., silicon nitride, silicon carbonitride, or silicon boron nitride.

The air gap 415 under the sixth opening 522 may not be filled, but may remain. The air gap 415 may also be referred to as an air spacer 415, and may form a spacer structure 445 together with the third and fifth spacers 380 and 430. For example, the air gap 415 may be a spacer including air therein. It should be appreciated that the air gap 415 may comprise a gap having air or other gases (e.g., such as those present during manufacturing) or may comprise a gap forming a vacuum therein.

Figure 29:
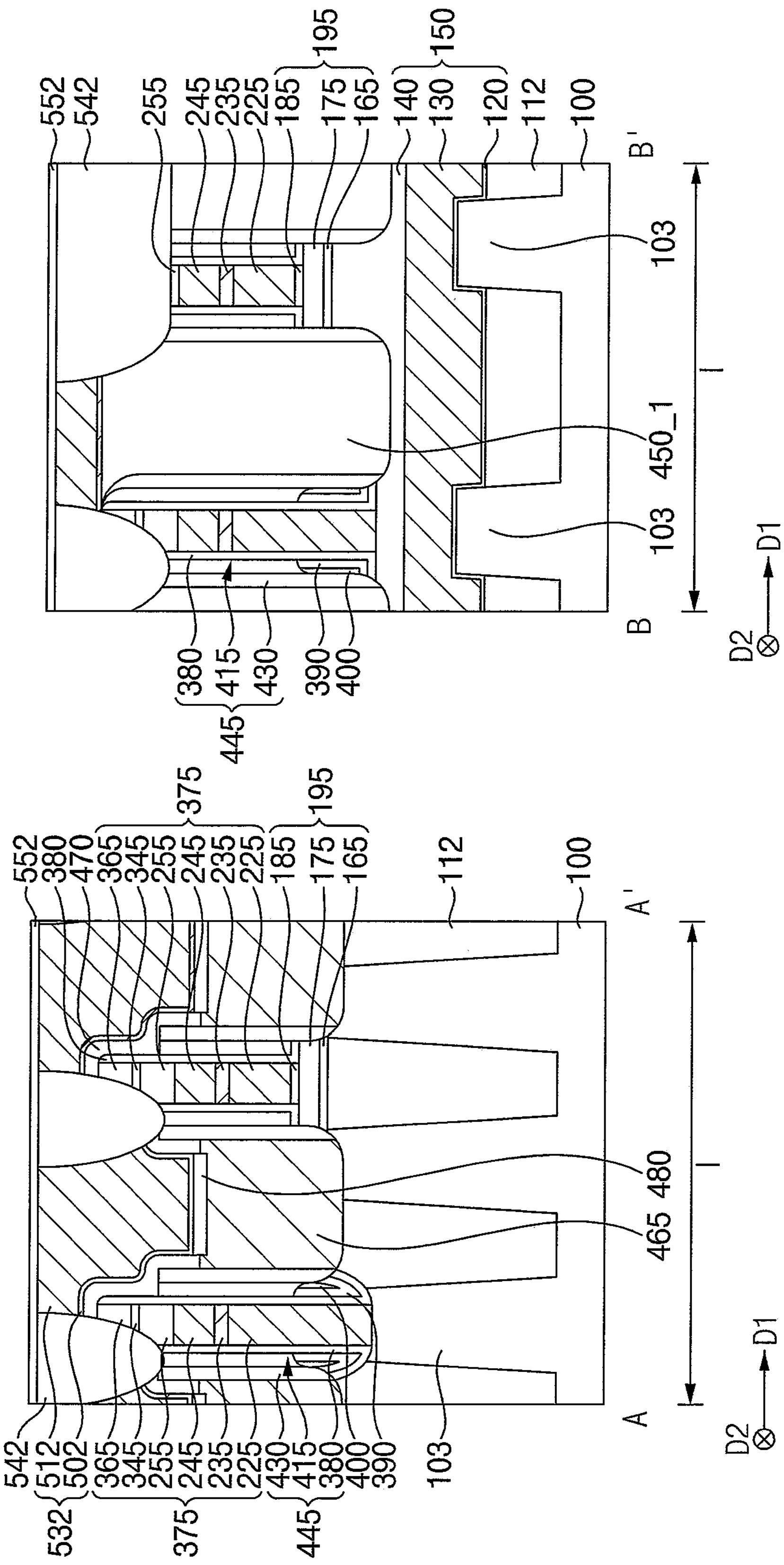
Figure 30:
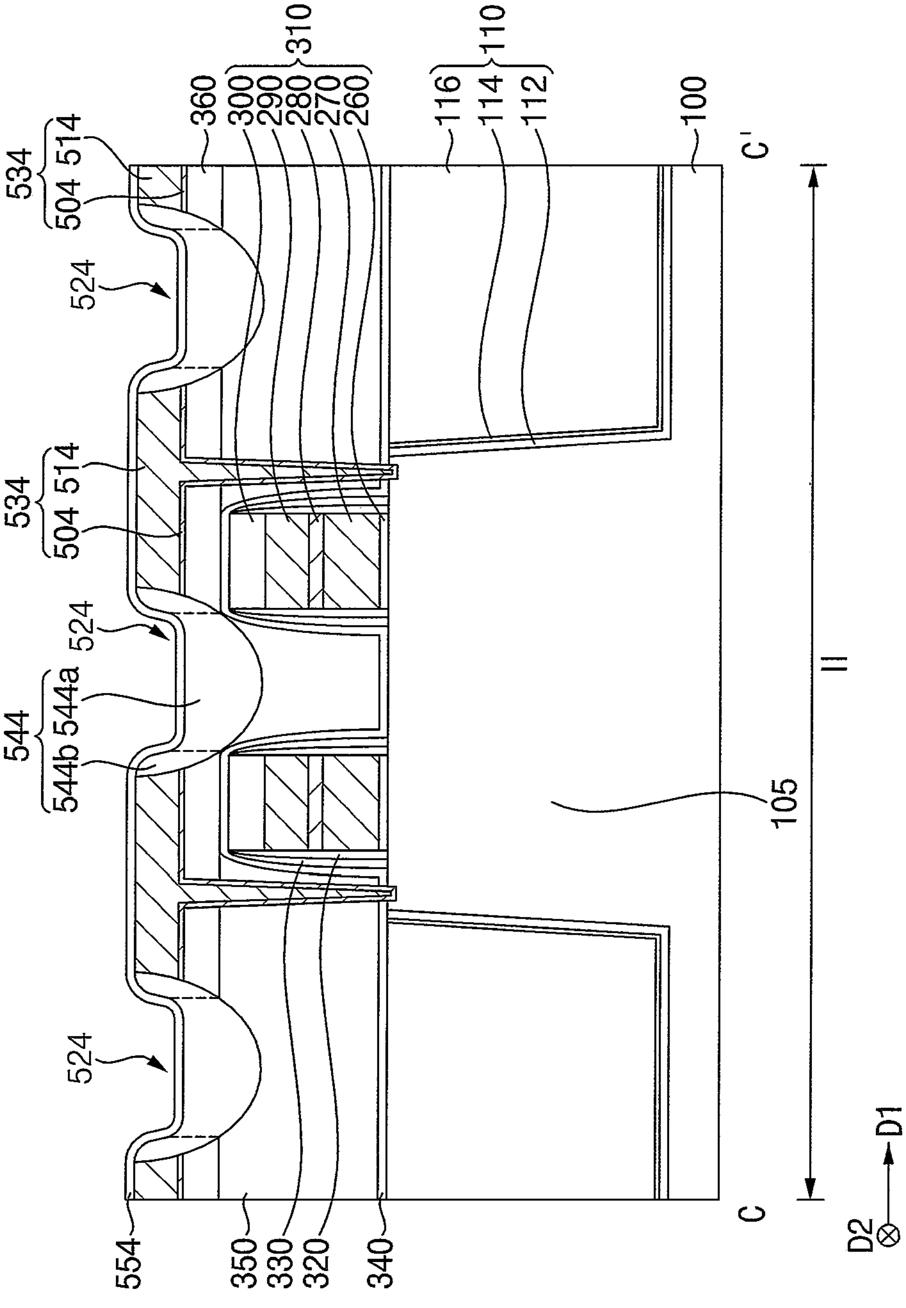

Referring to FIGS. 29 and 30, second and third etch stop layers 552 and 554 may be formed on the sixth insulation pattern 542 and the contact plug structure on the first region I of the substrate 100, and the seventh insulation pattern 544 and the wiring 534 on the second region II of the substrate 100, respectively.

In example embodiments, a portion of the third etch stop layer 554 in the seventh opening 524 may have a concave upper surface, and a thickness of the third etch stop layer 554 may be less than a thickness in the vertical direction of the lower portion **544*a* of the seventh insulation pattern 544**.

The second and third etch stop layers 552 and 554 may include or be formed of a material different from a material of the sixth and seventh insulation patterns 542 and 544, and may include or be formed of, e.g., silicon nitride, silicon carbonitride, silicon boron nitride, etc.

Figure 31:
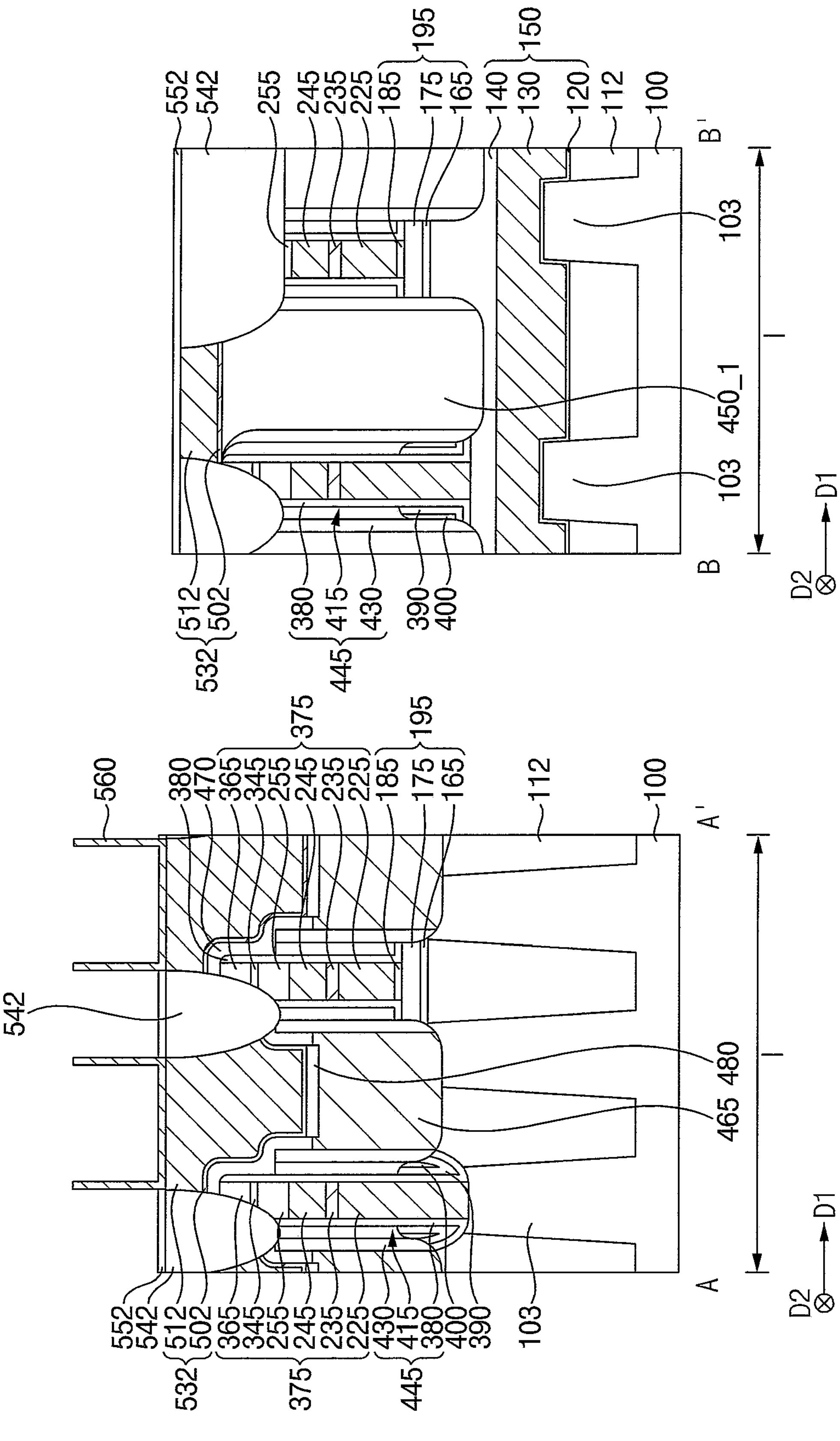

Referring FIG. 31, a mold layer may be formed on the second and third etch stop layers 552 and 554, and may be partially etched to form an eighth opening partially exposing an upper surface of the upper contact plug 532.

A lower electrode layer may be formed on the sidewall of the eighth opening, the exposed upper surface of the upper contact plug 532 and the mold layer, a sacrificial layer may be formed on the lower electrode layer to sufficiently fill a remaining portion of the eighth opening, and the lower electrode layer and the sacrificial layer may be planarized until an upper surface of the mold layer is exposed so that the lower electrode layer may be divided. The sacrificial layer and the mold layer may be removed by, e.g., a wet etching process, and thus a lower electrode 560 having a cylindrical shape may be formed on the exposed upper surface of the upper contact plug 532. Alternatively, the lower electrode 560 may have a pillar shape that may fill the eighth opening.

In example embodiments, the wet etching process may be performed using an etching solution including fluorine and hydrogen. The second etch stop layer 552 and the sixth insulation pattern 542 may prevent the etching solution from permeating into the upper contact plug 532, the bit line structure 375, the spacer structure 445 and the sixth spacer 470, and the third etch stop layer 554 and the seventh insulation pattern 544 may prevent the etching solution from permeating into the wiring 534, the first capping layer 360 and the first insulating interlayer 350.

The lower electrode 560 may include or be formed of, e.g., a metal, a metal nitride, a metal silicide, doped polysilicon, etc.

Figure 32:
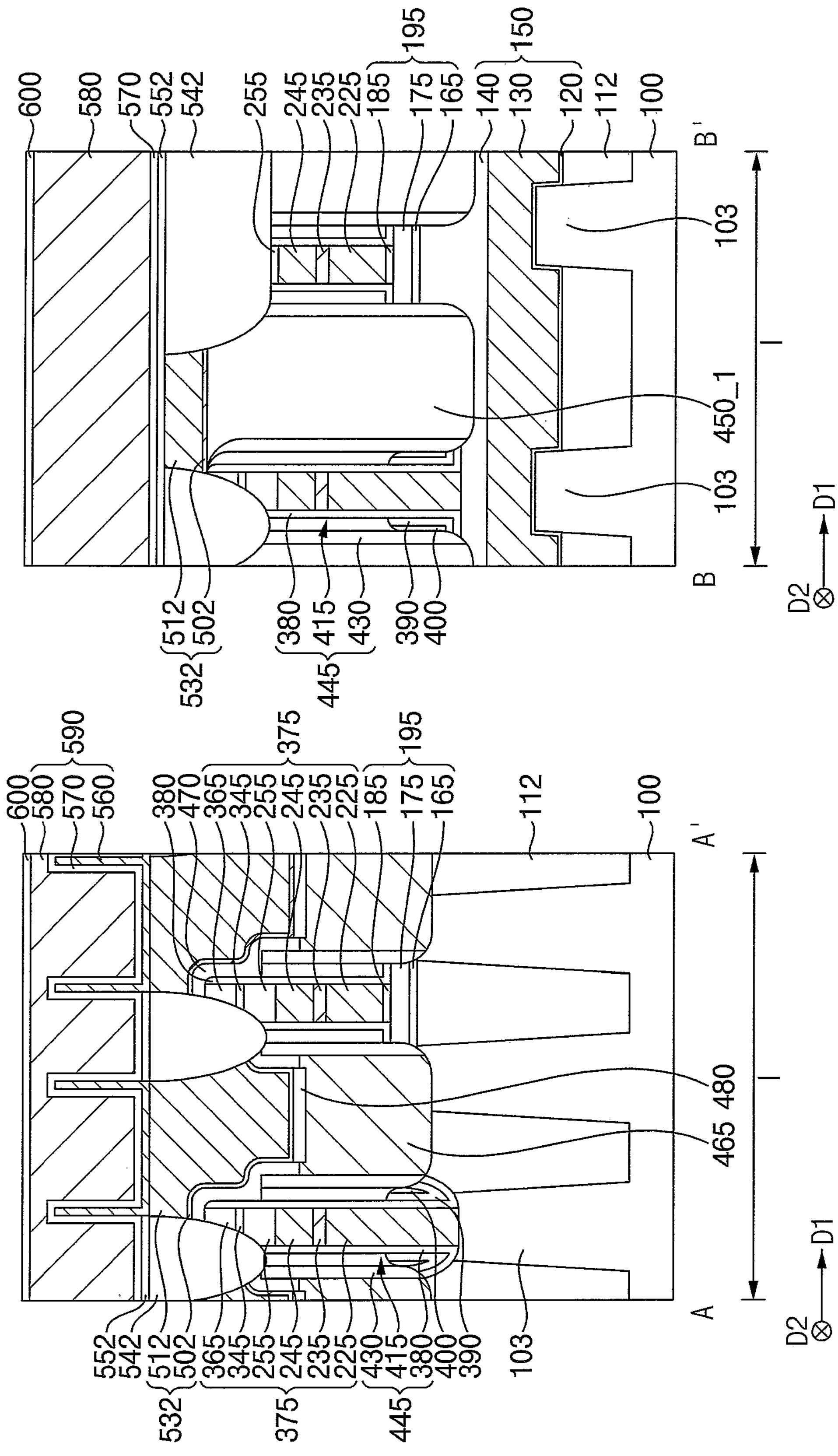
Figure 33:
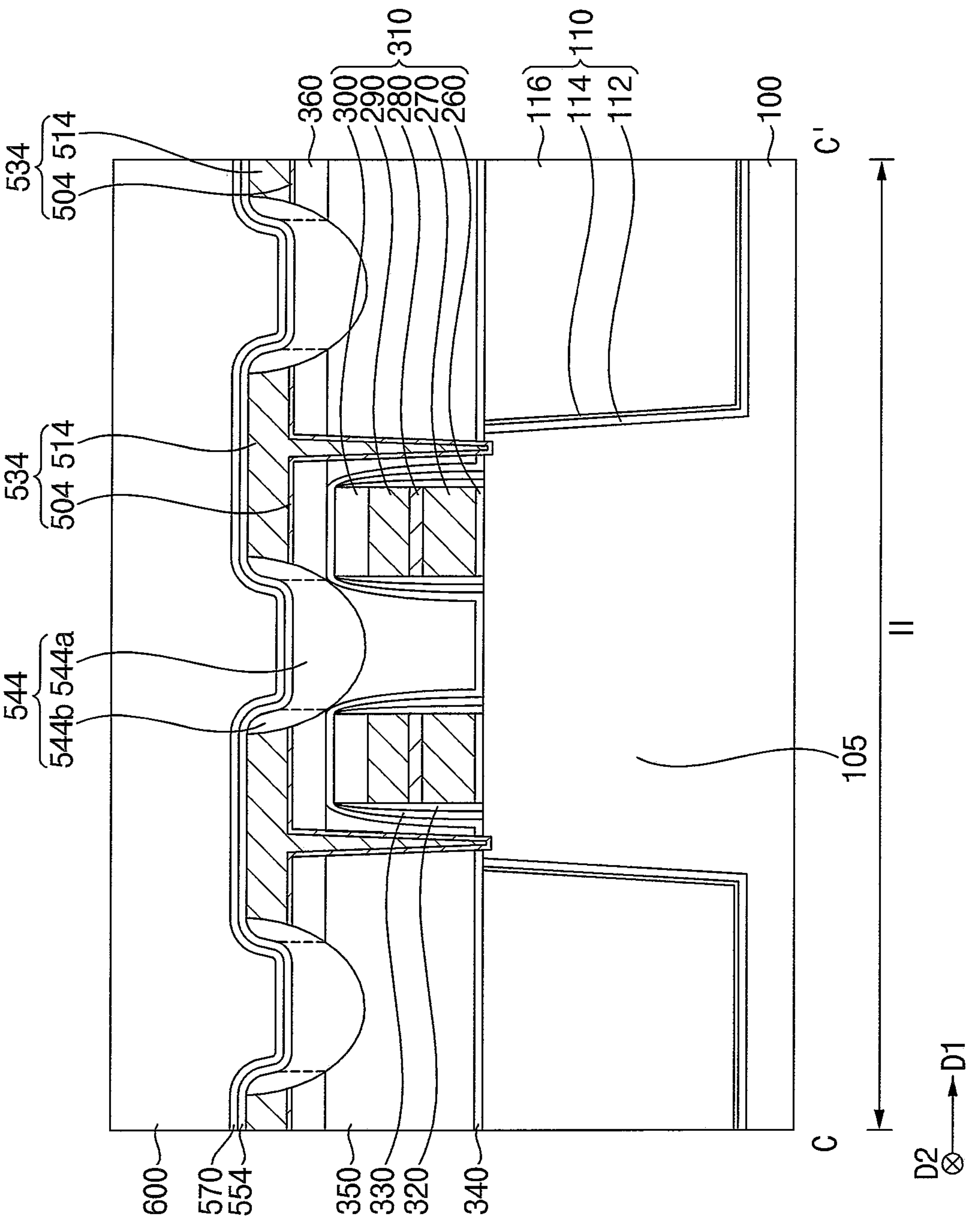

Referring to FIGS. 32 and 33, a dielectric layer 570 may be formed on a surface of the lower electrode 560 and the second and third etch stop layers 552 and 554, and an upper electrode 580 may be formed on the dielectric layer 570 so that a capacitor 590 including the lower electrode 560, the dielectric layer 570 and the upper electrode 580 may be formed on the first region I of the substrate 100.

The dielectric layer 570 may include or be formed of, e.g., a metal oxide, and the upper electrode 580 may include or be formed of, e.g., a metal, a metal nitride, a metal silicide, doped polysilicon, doped silicon-germanium, etc.

A second insulating interlayer 600 may be formed on the capacitor 590 on the first region I of the substrate 100 and the dielectric layer 570 on the second region II of the substrate 100 to complete the fabrication of the semiconductor device.

The second insulating interlayer 600 may include or be formed of an oxide, e.g., silicon oxide.

If the deposition inhibitor is not provided on the contact plug structure and the wiring 534 during the ALD process for forming the sixth insulation layer, the sixth insulation layer may have a thin uniform thickness on the bottom and the sidewall of the seventh opening 524, the contact plug structure and the wiring 534. The portion of the sixth insulation layer on the bottom of the seventh opening 524 and the portion of the sixth insulation layer on the contact plug structure and the wiring 534 may be removed by the anisotropic etching process, and thus not only the upper surface of the contact plug structure and the upper surface of the wiring 534 but also the bottom of the seventh opening 524 may be exposed, and the seventh insulation pattern 544 may be formed only on the sidewall of the seventh opening 524. As a result, only the third etch stop layer 554 having a thin thickness may be formed on the bottom of the seventh opening 524, and during the wet etching process for removing the sacrificial layer and the mold layer, the etching solution may permeate through the third etch stop layer 554 into the first insulating interlayer 350 including an oxide under the bottom of the seventh opening 524 so that the first insulating interlayer 350 may collapse.

In example embodiments, the deposition inhibitor may be provided on the contact plug structure and the wiring 534 during the ALD process so that the sixth insulation layer may be formed to have a thick thickness on the bottom of the seventh opening 524 and a thin thickness on the contact plug structure and the wiring 534. Even if the upper portion of the sixth insulation layer on the bottom of the seventh opening 524 is removed by the anisotropic etching process, the lower portion **544*a* of the seventh insulation pattern 544 may be formed to have a thick thickness on the bottom of the seventh opening 524. For example, the third etch stop layer 554 and the lower portion 544*a* of the seventh insulation pattern 544 may have a sufficiently thick thickness so as to prevent the etching solution from permeating into the first insulating interlayer 350, and thus the first insulating interlayer 350** may not collapse.

The semiconductor device manufactured by the above processes may have following structural characteristics.

The semiconductor device may include the substrate 100 including the first region I and the second region II surrounding the first region I, the first active pattern 103 on the first region I of the substrate 100, the first gate structure 150 buried in an upper portion of the first active pattern 103 and extending in the first direction D1, the bit line structure 375 contacting a central upper surface of the first active pattern 103 and extending in the second direction D2, the contact plug structure on each end of the first active pattern 103, the capacitor 590 on the contact plug structure, the second active pattern 105 on the second region II of the substrate 100, the second gate structure 310 on the second active pattern 105, the first insulating interlayer 350 covering a sidewall of the second gate structure 310, the first capping layer 360 on the second gate structure 310 and the first insulating interlayer 350, the wiring 534 on the first capping layer 360, the seventh insulation pattern 544 on the bottom and the sidewall of the seventh opening 524 extending through the wiring 534 and at least an upper portion of the first capping layer 360, and the third etch stop layer 554 on the seventh insulation pattern 544 and the wiring 534. The semiconductor device may further include the isolation pattern structure 110, the insulation pattern structure 195, the spacer structure 445, the sixth spacer 470, the fourth to sixth insulation patterns 390, 400 and 542, the third capping pattern 450_1, the second etch stop layer 552 and the second insulating interlayer 600.

In example embodiments, the first active pattern 103 may extend in the third direction D3, and a plurality of first active patterns 103 may be formed to be spaced apart from each other in each of the first and second directions D1 and D2. Thus, a plurality of first gate structures 150 may be spaced apart from each other in the second direction D2, a plurality of bit line structures 375 may be spaced apart from each other in the first direction D1, and the contact plug structure may be formed on each opposite end portions in the third direction D3 of the first active pattern 103.

In example embodiments, the sixth insulation pattern 542 may entirely fill a space between the contact plug structures, and may contact an upper portion of the bit line structure 375.

In example embodiments, an upper surface of the first capping layer 360 may be substantially coplanar with an upper surface of the bit line structure 375, and an upper surface of the contact plug structure may be substantially coplanar with an upper surface of the wiring 534.

FIGS. 34 to 37 are cross-sectional views illustrating a method of manufacturing a semiconductor device. This method may include processes substantially the same as or similar to those illustrated with reference to FIGS. 1 to 33, and repeated explanations thereof are omitted herein.

Figure 34:
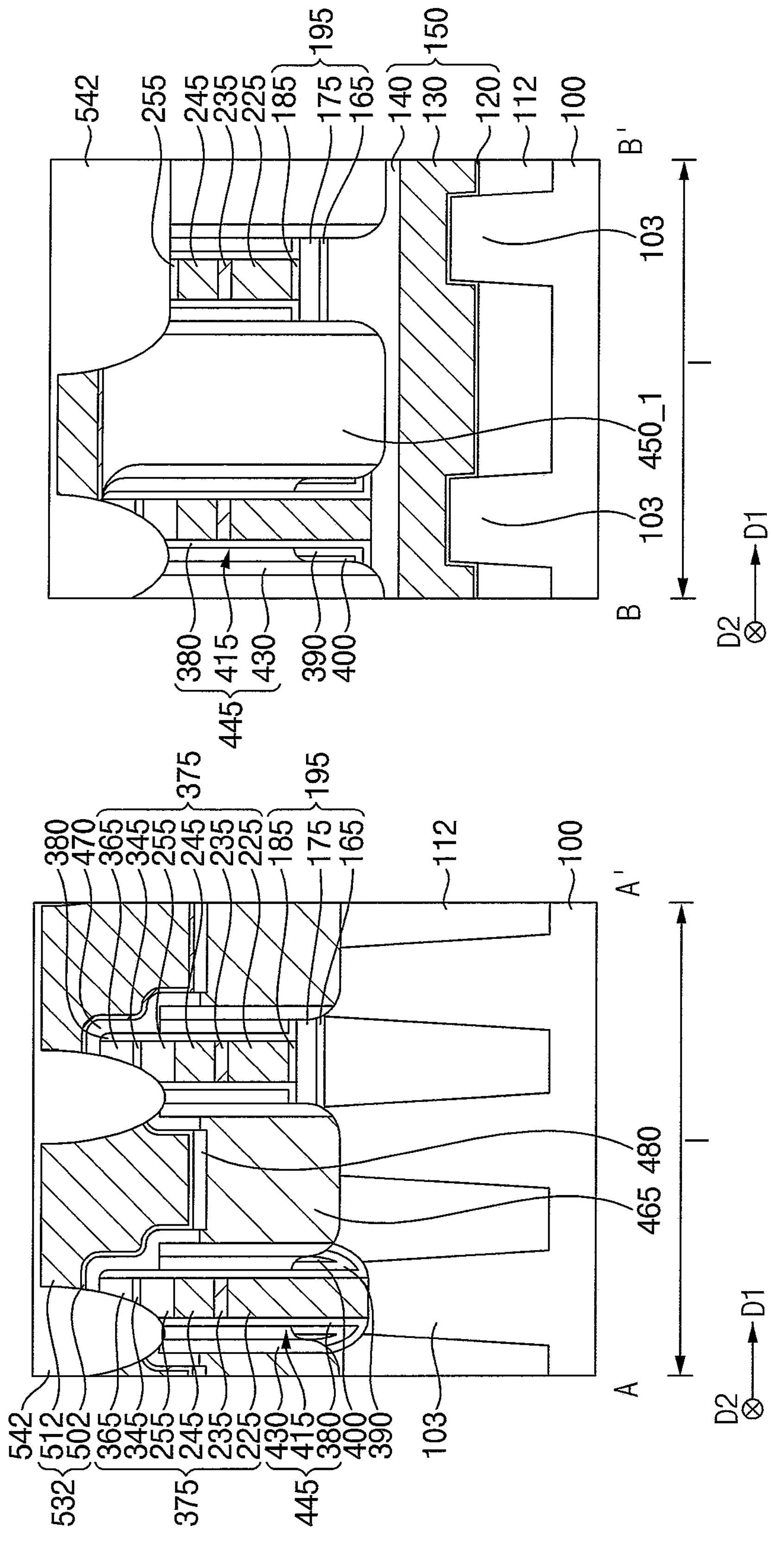
FIGS. 34 to 37 are cross-sectional views illustrating a method of manufacturing a semiconductor device according to example embodiments.
Figure 35:
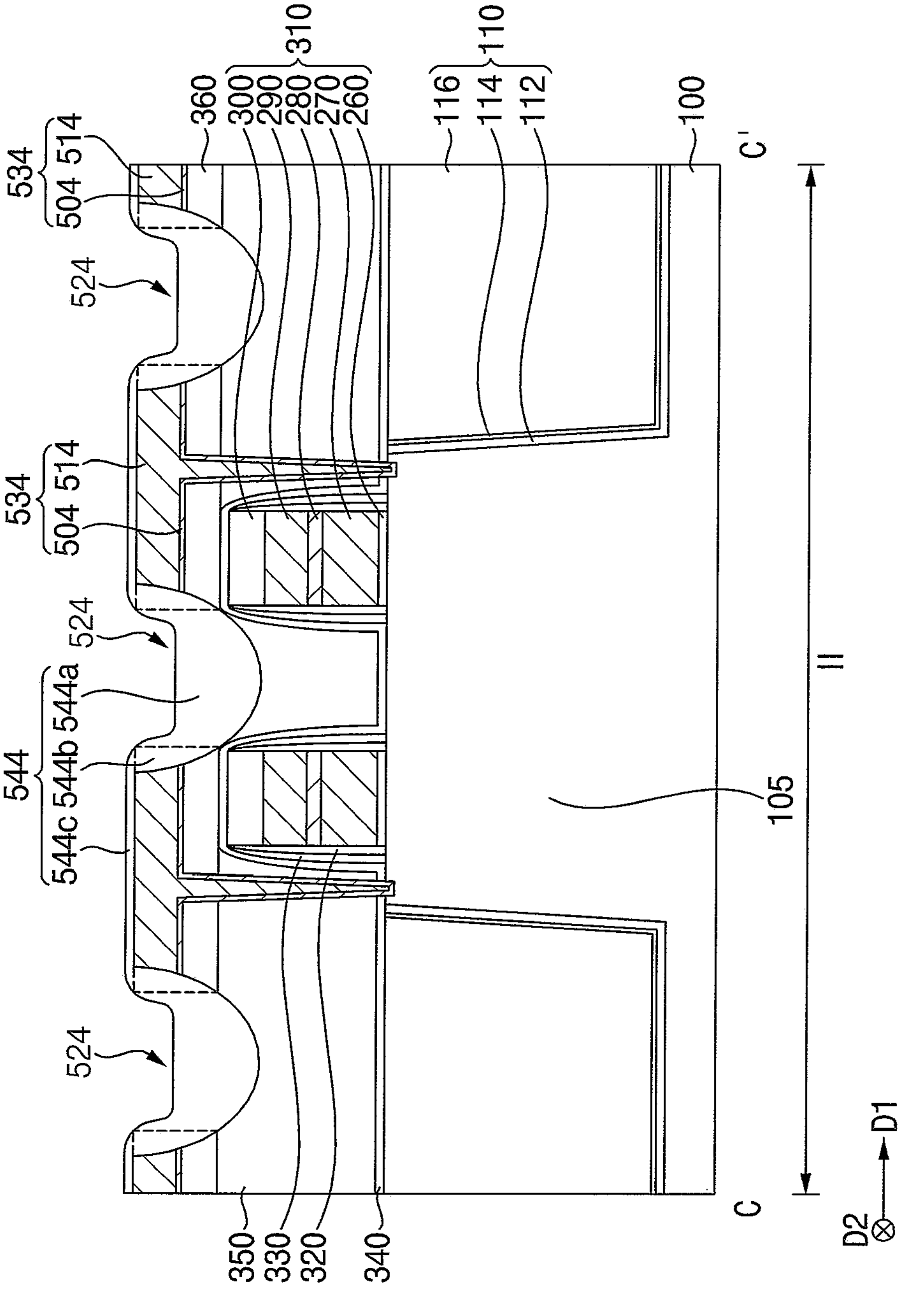

FIGS. 34 and 35, processes substantially the same as or similar to those illustrated with reference to FIGS. 1 to 30 may be performed, so that the sixth insulation pattern 542 filling the sixth opening 522 may be formed on the contact plug structure and that the seventh insulation pattern 544 partially filling the seventh opening 524 may be formed on the wiring 534.

The sixth and seventh insulation patterns 542 and 544 may be formed only by the deposition process, and the anisotropic etching process may not be performed. Thus, the sixth insulation pattern 542 may include a first portion filling the sixth opening 522, and a second portion on the first portion and the contact plug structure. The seventh insulation pattern 544 may include the lower portion 544*a* on the bottom of the seventh opening 524, the lateral portion 544*b* contacting the sidewall of the seventh opening 524, and an upper portion 544*c* on the lateral portion 544*b* and the upper surface of the wiring 534. The upper portion 544*c* of the seventh insulation pattern 544 may have a thickness less than a thickness of the lower portion 544*a* of the seventh insulation pattern 544, and substantially equal to a thickness of the second portion of the sixth insulation pattern 542.

The sixth and seventh insulation patterns 542 and 544 may be formed only by the deposition process, and thus the process margin may be enhanced.

Figure 36:
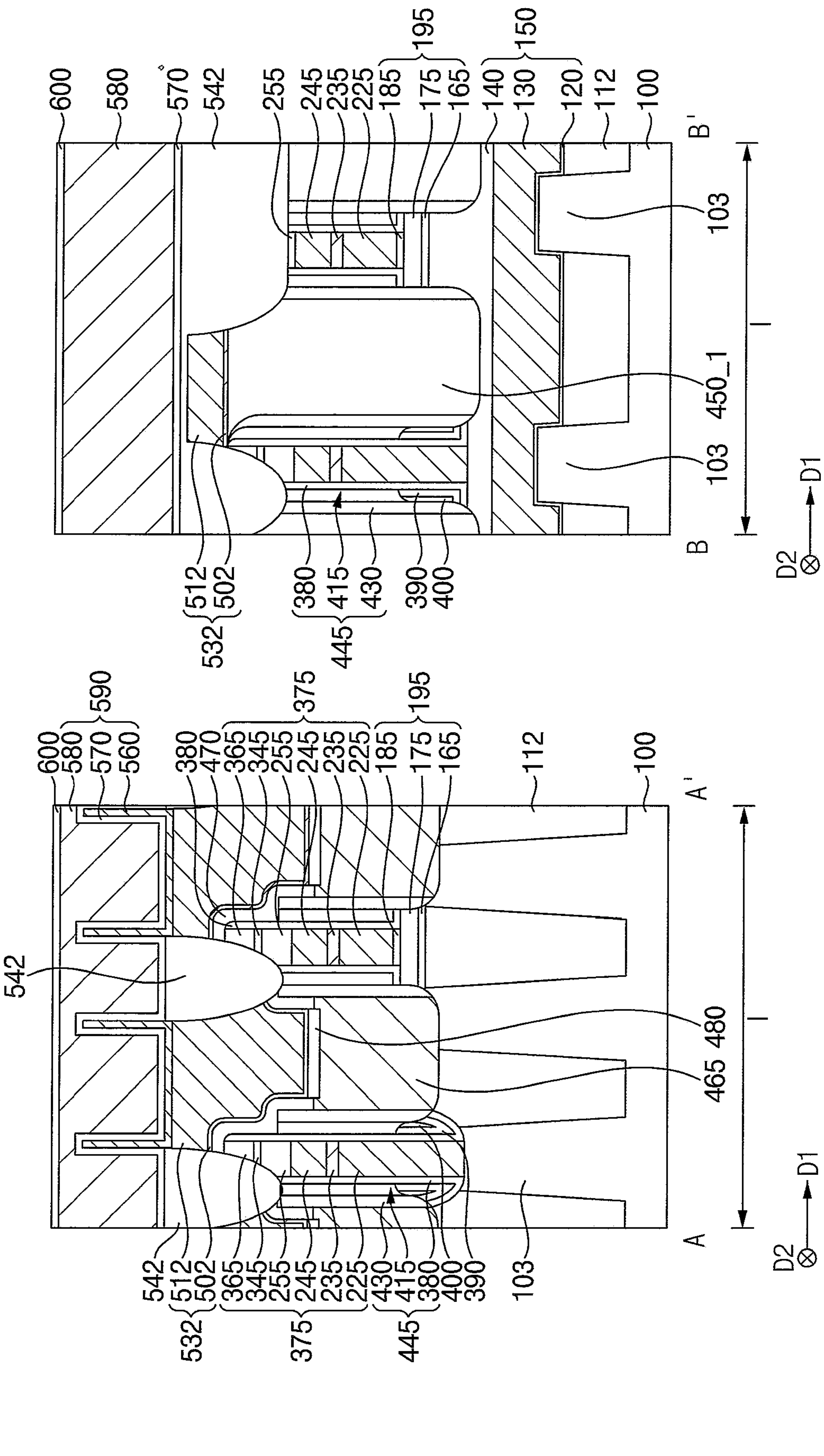
Figure 37:
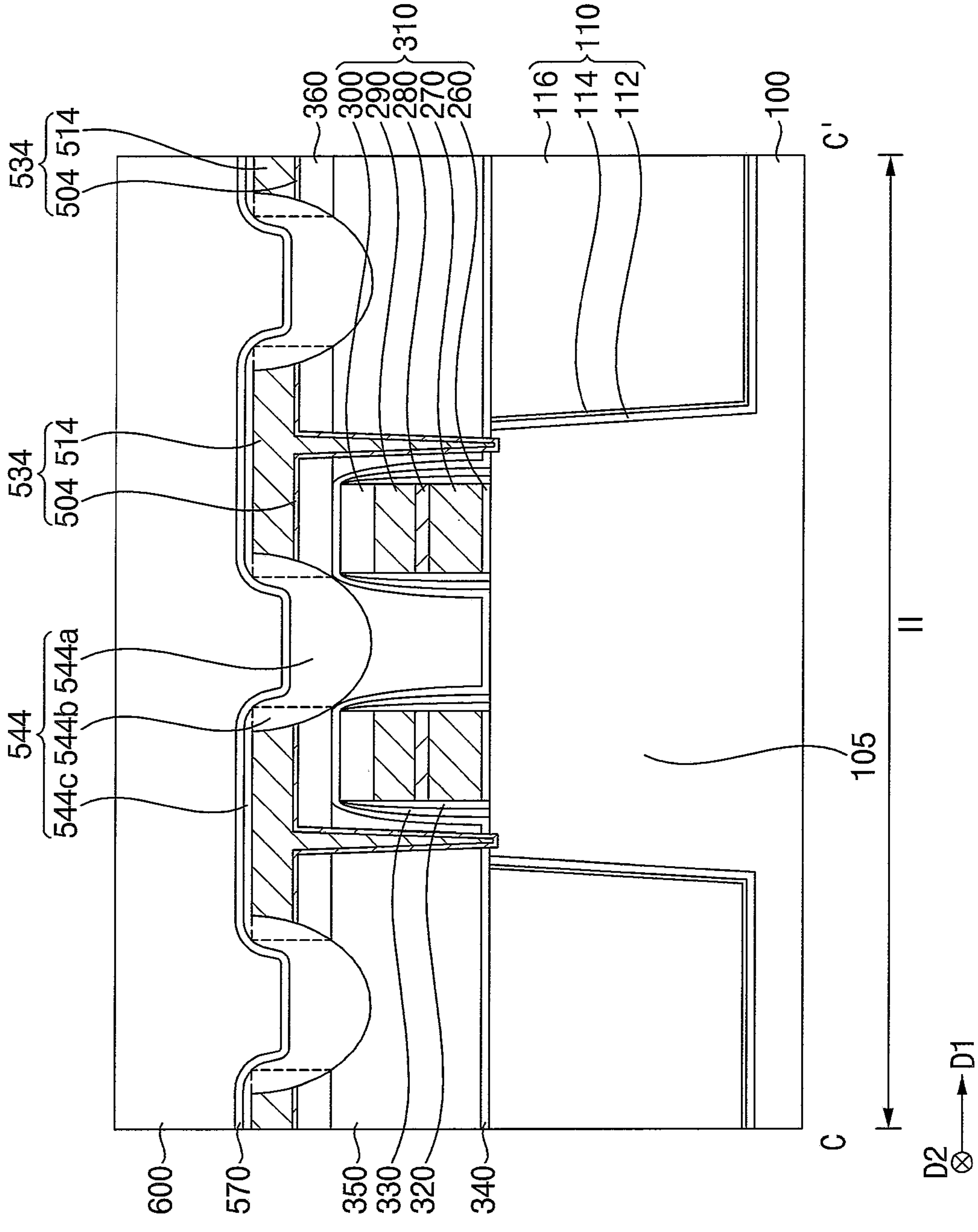

Referring to FIGS. 36 and 37, the capacitor 590 and the second insulating interlayer 600 may be sequentially stacked on the sixth and seventh insulation patterns 542 and 544, so that the fabrication of the semiconductor device may be completed.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a first gate structure and a second gate structure on a substrate;
an insulating interlayer on the substrate, the insulating interlayer covering a sidewall of each of the first gate structure and the second gate structure;
a capping layer on the first gate structure, the second gate structure, and the insulating interlayer;
a wiring on the capping layer;
an insulation pattern on a bottom and a sidewall of an opening, the opening extending through the wiring and at least an upper portion of the capping layer;
a first etch stop layer on the insulation pattern and the wiring; and
between the first gate structure and the second gate structure in a horizontal direction parallel to an upper surface of the substrate, a second etch stop layer covering a bottom surface of the insulating interlayer and the sidewall of each of the first gate structure and the second gate structure,
wherein the insulation pattern includes:
a lower portion on the bottom of the opening; and
a lateral portion contacting the sidewall of the opening, and
an upper portion on the lateral portion and an upper surface of the wiring,
wherein a thickness of the lower portion of the insulation pattern from the bottom of the opening in a vertical direction perpendicular to the upper surface of the substrate is greater than a thickness of the lateral portion of the insulation pattern from the sidewall of the opening in the horizontal direction,
wherein a top surface of the lateral portion of the insulation pattern is at a higher level than a top surface of the lower portion of the insulation pattern, and
wherein the upper portion of the insulation pattern covers an upper surface of the lateral portion of the insulation pattern and the upper surface of the wiring in the vertical direction.

2. The semiconductor device according to claim 1, wherein the opening extends through the capping layer, and exposes the insulating interlayer.

3. The semiconductor device according to claim 1, wherein the insulating interlayer includes silicon oxide.

4. The semiconductor device according to claim 1, wherein the insulation pattern and the first etch stop layer include different materials from each other.

5. The semiconductor device according to claim 1, wherein each of the insulation pattern and the first etch stop layer includes silicon nitride, silicon carbonitride or silicon boron nitride.

6. The semiconductor device according to claim 1, wherein the insulation pattern and the first etch stop layer include the same material.

7. The semiconductor device according to claim 1, wherein a portion of the first etch stop layer in the opening has a concave upper surface.

8. The semiconductor device according to claim 1, wherein the thickness of the lower portion of the insulation pattern in the vertical direction is greater than a thickness of the first etch stop layer.

9. A semiconductor device comprising:
a gate structure on a substrate;
an insulating interlayer on the substrate, the insulating interlayer covering a sidewall of the gate structure;
a capping layer on the gate structure and the insulating interlayer;
a wiring on the capping layer; and
an insulation pattern on an upper surface of the capping layer and on a bottom and a sidewall of an opening, the opening extending through the wiring and at least an upper portion of the capping layer,
wherein the insulation pattern includes:
a lower portion on the bottom of the opening;
a lateral portion contacting the sidewall of the opening; and
an upper portion on the lateral portion and an upper surface of the wiring,
wherein a thickness of the lower portion of the insulation pattern from the bottom of the opening in a vertical direction perpendicular to an upper surface of the substrate is greater than a thickness of the lateral portion of the insulation pattern from the sidewall of the opening in a horizontal direction parallel to the upper surface of the substrate, and
wherein an upper surface of the lower portion of the insulation pattern is exposed by the upper portion of the insulation pattern in the opening, and
wherein the upper portion of the insulation pattern covers an upper surface of the lateral portion of the insulation pattern and the upper surface of the wiring in the vertical direction.

10. The semiconductor device according to claim 9, wherein the thickness of the lower portion of the insulation pattern in the vertical direction is greater than a thickness of the upper portion of the insulation pattern.

11. The semiconductor device according to claim 9, wherein the opening extends through the capping layer, and exposes the insulating interlayer.

12. The semiconductor device according to claim 9, wherein the insulating interlayer includes silicon oxide.

13. The semiconductor device according to claim 9, wherein the insulation pattern includes silicon nitride, silicon carbonitride or silicon boron nitride.

14. A semiconductor device comprising:

a substrate including a cell region and a peripheral circuit region;

a first active pattern on the cell region of the substrate;

a first gate structure buried at an upper portion of the first active pattern, the first gate structure extending in a first direction parallel to an upper surface of the substrate;

a bit line structure contacting a central upper surface of the first active pattern, the bit line structure extending in a second direction parallel to the upper surface of the substrate and perpendicular to the first direction;

a contact plug structure on an end portion of the first active pattern;

a capacitor on the contact plug structure;

a second gate structure and a third gate structure on the peripheral circuit region of the substrate;

an insulating interlayer on the peripheral circuit region of the substrate and covering a sidewall of each of the second gate structure and the third gate structure;

a capping layer on the second gate structure, the third gate structure, and the insulating interlayer;

a wiring on the capping layer;

a first insulation pattern on a bottom and a sidewall of an opening, the opening extending through the wiring and at least an upper portion of the capping layer;

a first etch stop layer on the first insulation pattern and the wiring; and between the second gate structure and the third gate structure in a horizontal direction parallel to an upper surface of the substrate, a second etch stop layer covering a bottom surface of the insulating interlayer and the sidewall of each of the second gate structure and the third gate structure, wherein the first insulation pattern includes:

a lower portion on the bottom of the opening;

a lateral portion contacting the sidewall of the opening; and an upper portion on the lateral portion and an upper surface of the wiring, wherein a thickness of the lower portion of the first insulation pattern from the bottom of the opening in a vertical direction perpendicular to the upper surface of the substrate is greater than a thickness of the lateral portion of the first insulation pattern from the sidewall of the opening in the horizontal direction, wherein a top surface of the lateral portion of the first insulation pattern is at a higher level than a top surface of the lower portion of the first insulation pattern, and wherein the upper portion of the first insulation pattern covers an upper surface of the lateral portion of the first insulation pattern and the upper surface of the wiring in the vertical direction.

15. The semiconductor device according to claim 14, wherein:

the first active pattern is one of a plurality of first active patterns spaced apart from each other in each of the first direction and the second direction, each of the plurality of first active patterns extends in a third direction having an acute angle with respect to the first direction and the second direction, the bit line structure is one of a plurality of bit line structures spaced apart from each other in the first direction, and the contact plug structure is disposed on an end portion of each of the plurality of first active patterns that extend in the third direction.

16. The semiconductor device according to claim 15, wherein the contact plug structure is one of a plurality of contact plug structures, the semiconductor device further comprising:

a second insulation pattern that fills a space between neighboring ones of the plurality of contact plug structures, wherein the second insulation pattern includes a material the same as a material of the first insulation pattern.

17. The semiconductor device according to claim 16, further comprising:

a third etch stop layer on the second insulation pattern, wherein the third etch stop layer includes a material the same as a material of the first etch stop layer.

18. The semiconductor device according to claim 16, wherein the second insulation pattern contacts an upper portion of each of the plurality of bit line structures.

19. The semiconductor device according to claim 14, wherein an upper surface of the capping layer is coplanar with an upper surface of the bit line structure.

20. The semiconductor device according to claim 14, wherein an upper surface of the contact plug structure is coplanar with the upper surface of the wiring.

* * * * *